(12) United States Patent
Yang et al.

(10) Patent No.: US 7,827,450 B1
(45) Date of Patent: Nov. 2, 2010

(54) DEFECT DETECTION AND HANDLING FOR MEMORY BASED ON PILOT CELLS

(75) Inventors: Xueshi Yang, Sunnyvale, CA (US); Zining Wu, Los Altos, CA (US)

(73) Assignee: Marvell International Ltd., Hamilton (BM)

(*) Notice: Subject to any disclaimer, the term of this patent is extended or adjusted under 35 U.S.C. 154(b) by 379 days.

(21) Appl. No.: 12/052,350

(22) Filed: Mar. 20, 2008

Related U.S. Application Data

(63) Continuation-in-part of application No. 11/986,872, filed on Nov. 27, 2007, and a continuation-in-part of application No. 12/029,134, filed on Feb. 11, 2008.

(60) Provisional application No. 60/895,862, filed on Mar. 20, 2007, provisional application No. 60/867,492, filed on Nov. 28, 2006, provisional application No. 60/889,441, filed on Feb. 12, 2007.

(51) Int. Cl.
*G06F 11/00* (2006.01)
*G11C 29/00* (2006.01)

(52) U.S. Cl. .................. 714/704; 714/718; 714/723

(58) Field of Classification Search .......... 714/704, 714/708, 723, 718, 736, 745, 710, 738, 763; 375/224, 227; 365/185.33
See application file for complete search history.

(56) References Cited

U.S. PATENT DOCUMENTS

| | | | |
|---|---|---|---|
| 6,279,133 B1 | 8/2001 | Vafai et al. | |
| 6,501,812 B1 | 12/2002 | Yada | |
| 2007/0067704 A1 | 3/2007 | Altintas et al. | |
| 2007/0171714 A1 | 7/2007 | Wu et al. | |
| 2007/0171730 A1 | 7/2007 | Ramamoorthy et al. | |
| 2009/0059861 A1* | 3/2009 | Gunnarsson et al. | 370/331 |
| 2009/0110033 A1* | 4/2009 | Shattil | 375/141 |
| 2009/0296798 A1* | 12/2009 | Banna et al. | 375/229 |

FOREIGN PATENT DOCUMENTS

| | | |
|---|---|---|
| GB | 2 418 820 A | 4/2006 |
| WO | WO2007/132453 A | 11/2007 |

OTHER PUBLICATIONS

The International Search Report and the Written Opinion of the International Searching Authority, or the Declaration mailed Mar. 3, 2009 for International Application No. PCT/US2008/074414 filed Aug. 27, 2008; 13 pages.

* cited by examiner

*Primary Examiner*—Phung M Chung

(57) ABSTRACT

A memory system includes a first parameter estimation module that receives pilot signals that are generated based on pilot data stored in a memory. The first parameter estimate module generates a first estimate of a signal quality value associated with a block of the memory based on reference pilot information. A second parameter estimation module generates a second estimate of the signal quality value based on the first estimate and user data signals that are generated based on user data stored in the memory. A processing module generates recovered user data based on the second estimate.

68 Claims, 16 Drawing Sheets

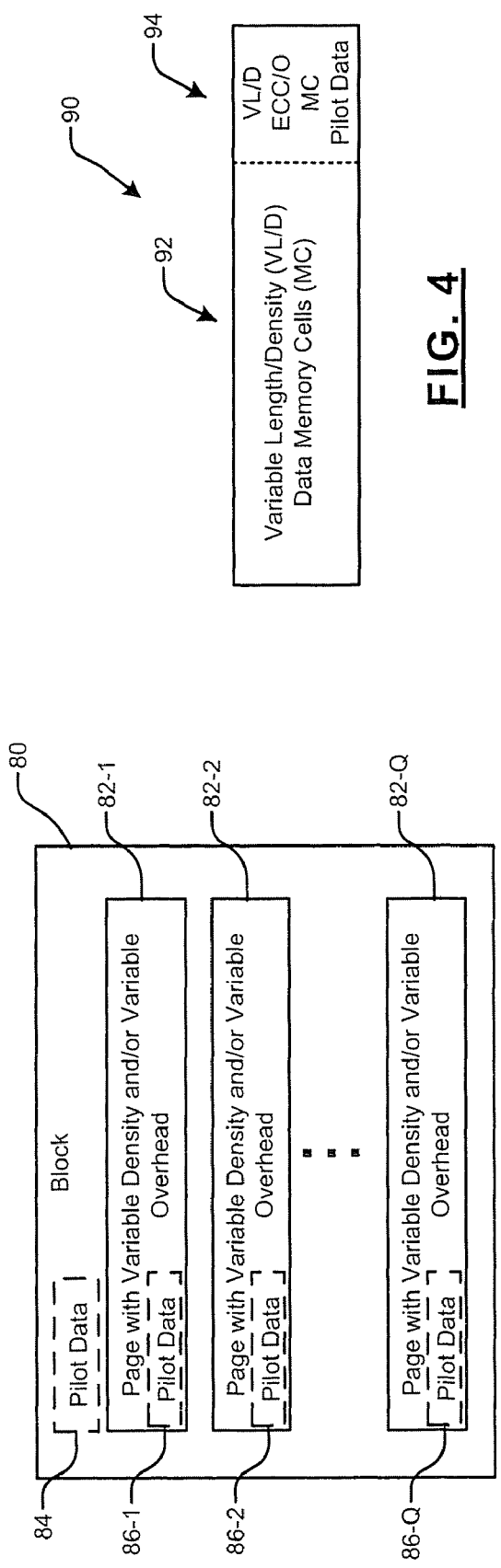
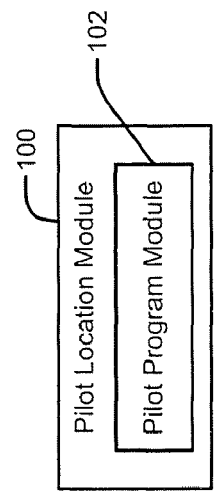

DEFECT DETECTION AND HANDLING FOR MEMORY BASED ON PILOT CELLS

CROSS-REFERENCE TO RELATED APPLICATIONS

This application claims the benefit of U.S. Provisional Application No. 60/895,862, filed on Mar. 20, 2007. This application is a continuation-in-part of U.S. patent application Ser. No. 11/986,872, filed on Nov. 27, 2007, which claims the benefit of U.S. Provisional Application No. 60/867,492, filed on Nov. 28, 2006 and of U.S. patent application Ser. No. 12/029,134, filed on Feb. 11, 2008, which claims the benefit of U.S. Provisional Application No. 60/889,441, filed on Feb. 12, 2007. The disclosures of the above applications are incorporated herein by reference in their entirety.

FIELD

The present disclosure relates to memory and, more particularly, to defect handling of non-volatile and volatile memory.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Non-volatile semiconductor memory may include flash memory, static random access memory (SRAM), nitride read only memory (NROM), phase change memory, magnetic RAM, multi-state memory, etc. Non-volatile semiconductor memory may include hard defects or soft defects. Hard defects refer to defects that occur during manufacturing of a memory device and can be detected during an inspection process. Soft defects are defects that occur due to aging and use of a memory device ("wear and tear").

Memory may be arranged in a hierarchy having levels. Memory defects may be associated with one or more levels of the hierarchy. A memory device may be divided into the levels of the hierarchy based on memory block size. Example levels in order of decreasing size include zones, sectors, pages, and/or arrays.

The hard defects may be detected and identified via scanning. The identification may include the location, type, and size of the portion of memory associated with the defect. In contrast, the soft defects are more difficult to detect since they occur over time during use.

SUMMARY

In one embodiment, a memory system is provided that includes a first parameter estimation module that receives pilot signals that are generated based on pilot data stored in a memory. The first parameter estimate module generates a first estimate of a signal quality value associated with a block of the memory based on reference pilot information. A second parameter estimation module generates a second estimate of the signal quality value based on the first estimate and user data signals that are generated based on user data stored in the memory. A processing module generates recovered user data based on the second estimate.

In other features, the memory system includes a first storage device that stores the pilot signals based on a read signal from the memory. A second storage device that stores the user data signals based on a read signal from the memory.

In other features, the first parameter estimation module provides a coarse estimate of the signal quality value and the second parameter estimation module provides a fine estimate of the signal quality value. In other features, the pilot data and the user data are stored in the block.

In other features, the memory system includes a demultiplexer that generates the pilot signals and user data signals based on the read signal from the memory. In other features, the memory system includes the memory. In other features, the memory includes non-volatile memory.

In other features, the processing module stores the pilot data in the memory when the user data is stored in the memory. In other features, the processing module reads the pilot data from the memory when the user data is read from the memory. In other features, the processing module removes the pilot data from the memory when the user data is removed from the memory. In other features, the processing module alters the pilot data between access events to pilot cells of the memory.

In other features, the reference pilot information is hard-coded into firmware of the memory system. In other features, the reference pilot information is generated based on an algorithm run by the memory system. In other features, the reference pilot information is stored in the memory as the pilot data during an initial access to the memory.

In other features, the memory system includes another memory that stores the reference pilot information. In other features, the memory system includes a defect detection module that detects a defect of the memory based on at least one of the first estimate and the second estimate. A control module that adjusts access to the memory based on the defect.

In other features, the control module adjusts access to the memory when at least one of the first estimate and the second estimate exceeds a threshold. In other features, the threshold includes at least one of a mean threshold, a variance threshold, a distance between mean values threshold, a signal-to-noise ratio threshold, and an error count threshold. In other features, the control module sets the threshold based on at least one of an ambient temperature, a number of access cycles, and a signal-to-noise ratio.

In other features, the memory system includes a defect detection module that detects a defect of the memory based on the first estimate and not the second estimate. In other features, the first estimate includes at least one of a signal-to-noise ratio and an estimated count of pilot signal errors.

In other features, each of the first estimate and the second estimate includes at least one of a mean value, a variance value, and a distance between mean values. In other features, the memory system includes a slicer that detects when at least one of the first estimate and the second estimate exceeds a threshold.

In other features, the first parameter estimation module generates the first estimate based on a first least means squared (LMS) process, and the second parameter estimation module generates the second estimate based on a second LMS process. In other features, the second parameter estimation module generates the second estimate based on an iterative process that is initialized with the first estimate.

In other features, a memory system is provided and includes a first parameter estimation module that receives the pilot signals based on a read signal from a memory and that generates a first estimate of a signal quality value. The signal quality value is associated with a block of the memory based on reference pilot information. A detection module detects a defect in the block based on the first estimate. A control module that alters access to the block based on the defect.

In other features, the memory system includes a storage device that stores the pilot signals based on the read signal. The first paragraph estimation module receives the pilot signals from the storage device. In other features, the control module selectively prevents writing to, reading from, and erasing from the block based on the defect.

In other features, the control module selectively prevents writing to the block when the first estimate exceeds a first threshold and selectively prevents access to the block when the first estimate exceeds a second threshold.

In other features, the control module selectively adjusts access to the memory when at least one of the first estimate and a second estimate of the signal quality value exceeds a threshold. In other features, the threshold includes at least one of a mean threshold, a variance threshold, a distance between mean values threshold, a signal-to-noise ratio threshold, and an error count threshold.

In other features, the control module sets the threshold based on at least one of an ambient temperature, a number of access cycles, and a signal-to-noise ratio. In other features, the first parameter estimation module generates the first estimate based on a first least means squared (LMS) process.

In other features, the control module alters access to the block based on the first estimate and a second estimate that is generated via a second LMS process that is based on the first estimate. In other features, the second LMS process is an iterative process that is initialized with the first estimate.

In other features, the memory system includes a second parameter estimation module that generates a second estimate of the signal quality value based on at least one of the first estimate and user data signals. The user data signals are generated based on user data stored in the block. The detection module detects the defect based on the second estimate.

In other features, the memory system includes a defect memory that stores a defect map of defects of the block. In other features, the defect map maps signal quality values to locations of the memory. In other features, the memory system includes an error counter that has an error value that is incremented when an error in one of the pilot signals is detected.

In other features, the detection module stores the error value in a defect memory in reference to the block. In other features, the memory system includes a signal processing module that generates recovered user data that is based on user data that is stored in the memory and the first estimate.

In other features, the memory system includes a second parameter estimation module that generates a second estimate of the signal quality value based on at least one of the first estimate and user data signals stored in the memory. In other features, the detection module detects the defect based on the first estimate and the second estimate.

In other features, the detection module detects the defect based on the first estimate and not the second estimate. In other features, the first estimate includes a signal-to-noise ratio value. In other features, the first estimate includes at least one of a mean value, a variance value, a standard deviation value, and a distance between mean values.

In other features, a memory system is provided and includes a first parameter estimation module that generates a first estimate of a signal quality value based on user data signals. The user data signals are generated based on a read signal from a memory. A detection module detects a defect in a block of the memory based on the first estimate. A control module alters access to the block based on the defect.

In other features, the memory system includes a storage device that stores the user data signals based on the read signal, the first parameter estimation module receives the user data signals from the storage device.

In other features, the control module prevents writing to, reading from, and erasing from the block based on the defect. In other features, the control module prevents writing to the block when the first estimate exceeds a first threshold and prevents access to the block when the first estimate exceeds a second threshold.

In other features, the control module adjusts access to the memory when the first estimate exceeds a threshold. In other features, the threshold includes at least one of a mean threshold, a variance threshold, a distance between mean values threshold, a signal-to-noise ratio threshold, and an error threshold.

In other features, the control module sets the threshold based on at least one of an ambient temperature, a number of access cycles, and a signal-to-noise ratio. In other features, the first parameter estimation module generates the first estimate based on a first least means squared (LMS) process.

In other features, the control module alters access to the block based on the first estimate and a second estimate that is generated via a second LMS process that is based on the first estimate. In other features, the second LMS process is an iterative process that is initialized with the first estimate.

In other features, the memory system includes a second parameter estimation module that generates a second estimate of the signal quality value based on the first estimate and pilot signals. The pilot signals are generated based on pilot data stored in the memory. The detection module detects the defect based on the second estimate.

In other features, the memory system includes a defect memory that stores a defect map that stores a defect map of defects of the block. In other features, the defect map maps signal quality values to locations of the memory.

In other features, the memory system includes an error counter that has an error value that is incremented when an error in one of the user data signals is detected. In other features, the memory detection module stores the error value in a defect memory in reference to the block.

In other features, the first parameter estimation module generates the first estimate based on a decision feedback signal generated based on a decoded user data signal. In other features, the memory system includes a signal processing module that generates recovered user data based on the user data signals and the first estimate.

In other features, the memory system includes a second parameter estimation module that generates a second estimate of the signal quality value based on pilot signals that are generated based on pilot data stored in the block.

In other features, the detection module detects the defect based on the first estimate and the second estimate. In other features, the detection module detects the defect based on the first estimate and not the second estimate.

In other features, the first estimate includes a signal-to-noise ratio value. In other features, the first estimate includes at least one of a mean value, a variance value, a standard deviation value, and a distance between mean values.

In other features, a method of operating a memory system is provided and includes receiving pilot signals that are generated based on pilot data stored in a memory. A first estimate of a signal quality value associated with a block of the memory is generated based on reference pilot information. A second estimate of the signal quality value is generated based on the first estimate and user data signals that are generated based on user data stored in the memory. Recovered user data is generated based on the second estimate.

In other features, the method includes storing the pilot signals based on a read signal from the memory in a first storage device. The user data signals are stored based on a read signal from the memory in a second storage device.

In other features, the method includes providing a coarse estimate of the signal quality value and providing a fine estimate of the signal quality value. In other features, the pilot data and the user data are stored in the block. In other features, the method includes generating the pilot signals and user data signals based on the read signal from the memory.

In other features, the method includes storing the pilot data in the memory when the user data is stored in the memory. In other features, the method includes reading the pilot data from the memory when the user data is read from the memory. In other features, the method includes removing the pilot data from the memory when the user data is removed from the memory. In other features, the method includes altering the pilot data between access events to pilot cells of the memory.

In other features, the reference pilot information is hard-coded into firmware of the memory system. In other features, the reference pilot information is generated based on an algorithm run by the memory system. In other features, the reference pilot information is stored in the memory as the pilot data during an initial access to the memory.

In other features, the method includes storing the reference pilot information in another memory. In other features, the method includes detecting a defect of the memory based on at least one of the first estimate and the second estimate; and adjusting access to the memory based on the defect.

In other features, the method includes adjusting access to the memory when at least one of the first estimate and the second estimate exceeds a threshold. In other features, the threshold includes at least one of a mean threshold, a variance threshold, a distance between mean values threshold, a signal-to-noise ratio threshold, and an error count threshold.

In other features, the method includes setting the threshold based on at least one of an ambient temperature, a number of access cycles, and a signal-to-noise ratio.

In other features, the method includes detecting a defect of the memory based on the first estimate and not the second estimate.

In other features, the first estimate includes at least one of a signal-to-noise ratio and an estimated count of pilot signal errors. In other features, each of the first estimate and the second estimate includes at least one of a mean value, a variance value, and a distance between mean values.

In other features, the method includes detecting when at least one of the first estimate and the second estimate exceeds a threshold. In other features, the first estimate is generated based on a first least means squared (LMS) process. The second estimate is generated based on a second LMS process. In other features, the second estimate is generated based on an iterative process that is initialized with the first estimate.

In other features, a method of operating a memory system is provided and includes receiving the pilot signals based on a read signal from a memory. A first estimate of a signal quality value associated with a block of the memory is generated based on reference pilot information. A defect in the block is detected based on the first estimate. Access to the block is altered based on the defect.

In other features, the method includes storing the pilot signals based on the read signal, and receiving the pilot signals from a storage device. In other features, the method includes selectively preventing writing to, reading from, and erasing from the block based on the defect.

In other features, the method includes selectively preventing writing to the block when the first estimate exceeds a first threshold and selectively prevents access to the block when the first estimate exceeds a second threshold.

In other features, the method includes selectively adjusting access to the memory when at least one of the first estimate and a second estimate of the signal quality value exceeds a threshold. In other features, the threshold includes at least one of a mean threshold, a variance threshold, a distance between mean values threshold, a signal-to-noise ratio threshold, and an error count threshold.

In other features, the method includes setting the threshold based on at least one of an ambient temperature, a number of access cycles, and a signal-to-noise ratio. In other features, the first estimate is generated based on a first least means squared (LMS) process.

In other features, the method includes altering access to the block based on the first estimate and a second estimate that is generated via a second LMS process that is based on the first estimate. In other features, the second LMS process is an iterative process that is initialized with the first estimate.

In other features, the method includes generating a second estimate of the signal quality value based on at least one of the first estimate and user data signals. The user data signals are generated based on user data stored in the block. The defect is detected based on the second estimate.

In other features, the method includes storing a defect map of defects of the block in a defect memory. In other features, the defect map maps signal quality values to locations of the memory.

In other features, the method includes incrementing an error value of an error counter when an error in one of the pilot signals is detected. In other features, the method includes storing the error value in a defect memory in reference to the block. In other features, the method includes generating recovered user data that is based on user data that is stored in the memory and the first estimate.

In other features, the method includes generating a second estimate of the signal quality value based on at least one of the first estimate and user data signals stored in the memory.

In other features, the defect is detected based on the first estimate and the second estimate. In other features, the defect is detected based on the first estimate and not the second estimate. In other features, the first estimate includes a signal-to-noise ratio value.

In other features, the first estimate includes at least one of a mean value, a variance value, a standard deviation value, and a distance between mean values.

In other features, a method of operating a memory system is provided and includes generating a first estimate of a signal quality value based on user data signals. The user data signals are generated based on a read signal from a memory. A defect in a block of the memory is detected based on the first estimate. Access to the block is altered based on the defect.

In other features, the method includes storing the user data signals based on the read signal in a storage device; and receiving the user data signals from the storage device. In other features, the method includes preventing writing to, reading from, and erasing from the block based on the defect.

In other features, the method includes preventing writing to the block when the first estimate exceeds a first threshold and prevents access to the block when the first estimate exceeds a second threshold.

In other features, the method includes adjusting access to the memory when the first estimate exceeds a threshold. In other features, the threshold includes at least one of a mean threshold, a variance threshold, a distance between mean values threshold, a signal-to-noise ratio threshold, and an error threshold.

In other features, the method includes setting the threshold based on at least one of an ambient temperature, a number of access cycles, and a signal-to-noise ratio. In other features, the method includes generating the first estimate based on a first least means squared (LMS) process.

In other features, the method includes altering access to the block based on the first estimate and a second estimate. The second estimate is generated via a second LMS process that is based on the first estimate.

In other features, the second LMS process is an iterative process that is initialized with the first estimate. In other features, the method includes generating a second estimate of the signal quality value based on the first estimate and pilot signals that are generated based on pilot data stored in the memory. The defect is detected based on the second estimate.

In other features, the method includes storing a defect map of defects of the block in a defect memory. In other features, the defect map maps signal quality values to locations of the memory.

In other features, the method includes incrementing an error value of an error counter when an error in one of the user data signals is detected. In other features, the method includes storing the error value in a defect memory in reference to the block.

In other features, the method includes generating the first estimate based on a decision feedback signal generated based on a decoded user data signal. In other features, the method includes generating recovered user data based on the user data signals and the first estimate.

In other features, the method includes generating a second estimate of the signal quality value based on pilot signals that are generated based on pilot data stored in the block. In other features, the method includes detecting the defect based on the first estimate and the second estimate.

In other features, the method includes detecting the defect based on the first estimate and not the second estimate. In other features, the first estimate includes a signal-to-noise ratio value.

In other features, the first estimate includes at least one of a mean value, a variance value, a standard deviation value, and a distance between mean values.

In other features, a memory system is provided and includes first parameter estimation means for receiving pilot signals that are generated based on pilot data stored in a memory. The first parameter estimate means generates a first estimate of a signal quality value associated with a block of the memory based on reference pilot information. Second parameter estimation means generates a second estimate of the signal quality value based on the first estimate and user data signals that are generated based on user data stored in the memory. Processing means generates recovered user data based on the second estimate.

In other features, the memory system includes first storage means for storing the pilot signals based on a read signal from the memory. Second storage means stores the user data signals based on a read signal from the memory.

In other features, the first parameter estimation means provides a coarse estimate of the signal quality value and the second parameter estimation means provides a fine estimate of the signal quality value. In other features, the pilot data and the user data are stored in the block.

In other features, the memory system includes demultiplexing means for generating the pilot signals and user data signals based on the read signal from the memory. In other features, the memory system includes the memory. In other features, the memory includes non-volatile memory.

In other features, the processing means stores the pilot data in the memory when the user data is stored in the memory. In other features, the processing means reads the pilot data from the memory when the user data is read from the memory. In other features, the processing means removes the pilot data from the memory when the user data is removed from the memory. In other features, the processing means alters the pilot data between access events to pilot cells of the memory.

In other features, the memory system of claim 1 further includes pilot generating means for generating the reference pilot information. In other features, the reference pilot information is hard-coded into firmware of the memory system. In other features, the reference pilot information is generated based on an algorithm run by the memory system. In other features, the reference pilot information is stored in the memory as the pilot data during an initial access to the memory.

In other features, the memory system includes another memory that stores the reference pilot information. In other features, the memory system includes defect detection means for detecting a defect of the memory based on at least one of the first estimate and the second estimate. Control means adjusts access to the memory based on the defect.

In other features, the control means adjusts access to the memory when at least one of the first estimate and the second estimate exceeds a threshold. In other features, the threshold includes at least one of a mean threshold, a variance threshold, a distance between mean values threshold, a signal-to-noise ratio threshold, and an error count threshold.

In other features, the control means sets the threshold based on at least one of an ambient temperature, a number of access cycles, and a signal-to-noise ratio. In other features, the memory system includes defect detection means for detecting a defect of the memory based on the first estimate and not the second estimate.

In other features, the first estimate includes at least one of a signal-to-noise ratio and an estimated count of pilot signal errors. In other features, each of the first estimate and the second estimate includes at least one of a mean value, a variance value, and a distance between mean values. In other features, the memory system includes slicing means for detecting when at least one of the first estimate and the second estimate exceeds a threshold.

In other features, the first parameter estimation means generates the first estimate based on a first least means squared (LMS) process. The second parameter estimation means generates the second estimate based on a second LMS process.

In other features, the second parameter estimation means generates the second estimate based on an iterative process that is initialized with the first estimate.

In other features, a memory system is provided and includes first parameter estimation means for receiving the pilot signals based on a read signal from a memory. The first parameter estimation means generates a first estimate of a signal quality value associated with a block of the memory based on reference pilot information. Detection means detects a defect in the block based on the first estimate. Control means alters access to the block based on the defect.

In other features, the memory system includes storage means for storing the pilot signals based on the read signal. The first paragraph estimation means receives the pilot signals from the storage device. In other features, the control means selectively prevents writing to, reading from, and erasing from the block based on the defect.

In other features, the control means selectively prevents writing to the block when the first estimate exceeds a first threshold and selectively prevents access to the block when the first estimate exceeds a second threshold.

In other features, the control means selectively adjusts access to the memory when at least one of the first estimate and a second estimate of the signal quality value exceeds a threshold.

In other features, the threshold includes at least one of a mean threshold, a variance threshold, a distance between mean values threshold, a signal-to-noise ratio threshold, and an error count threshold.

In other features, the control means sets the threshold based on at least one of an ambient temperature, a number of access cycles, and a signal-to-noise ratio. In other features, the first parameter estimation means generates the first estimate based on a first least means squared (LMS) process.

In other features, the control means alters access to the block based on the first estimate and a second estimate that is generated via a second LMS process that is based on the first estimate. In other features, the second LMS process is an iterative process that is initialized with the first estimate.

In other features, the memory system includes a second parameter estimation means that generates a second estimate of the signal quality value based on at least one of the first estimate and user data signals. The user data signals are generated based on user data stored in the block. The detection means detects the defect based on the second estimate.

In other features, the memory system includes defect storing means for storing a defect map of defects of the block. In other features, the defect map maps signal quality values to locations of the memory.

In other features, the memory system includes error counting means for counting an error value that is incremented when an error in one of the pilot signals is detected. In other features, the detection means stores the error value in a defect memory in reference to the block.

In other features, the memory system includes a signal processing means that generates recovered user data that is based on user data that is stored in the memory and the first estimate. In other features, the memory system includes a second parameter estimation means that generates a second estimate of the signal quality value based on at least one of the first estimate and user data signals stored in the memory.

In other features, the detection means detects the defect based on the first estimate and the second estimate. In other features, the detection means detects the defect based on the first estimate and not the second estimate. In other features, the first estimate includes a signal-to-noise ratio value. In other features, the first estimate includes at least one of a mean value, a variance value, a standard deviation value, and a distance between mean values.

In other features, a memory system is provided and includes first parameter estimation means for generating a first estimate of a signal quality value based on user data signals. The user data signals are generated based on a read signal from a memory. Detection means detects a defect in a block of the memory based on the first estimate. Control means alters access to the block based on the defect.

In other features, the memory system includes storing means for storing the user data signals based on the read signal. The first parameter estimation means receives the user data signals from the storage device.

In other features, the control means prevents writing to, reading from, and erasing from the block based on the defect. In other features, the control means prevents writing to the block when the first estimate exceeds a first threshold and prevents access to the block when the first estimate exceeds a second threshold.

In other features, the control means adjusts access to the memory when the first estimate exceeds a threshold. In other features, the threshold includes at least one of a mean threshold, a variance threshold, a distance between mean values threshold, a signal-to-noise ratio threshold, and an error threshold.

In other features, the control means sets the threshold based on at least one of an ambient temperature, a number of access cycles, and a signal-to-noise ratio. In other features, the first parameter estimation means generates the first estimate based on a first least means squared (LMS) process.

In other features, the control means alters access to the block based on the first estimate and a second estimate that is generated via a second LMS process that is based on the first estimate. In other features, the second LMS process is an iterative process that is initialized with the first estimate.

In other features, the memory system includes a second parameter estimation means that generates a second estimate of the signal quality value based on the first estimate and pilot signals. The pilot signals are generated based on pilot data stored in the memory. The detection means detects the defect based on the second estimate.

In other features, the memory system includes defect storing means for storing a defect map that stores a defect map of defects of the block. In other features, the defect map maps signal quality values to locations of the memory.

In other features, the memory system includes error counting means for counting an error value that is incremented when an error in one of the user data signals is detected. In other features, the memory detection means stores the error value in a defect memory in reference to the block.

In other features, the first parameter estimation means generates the first estimate based on a decision feedback signal generated based on a decoded user data signal. In other features, the memory system includes signal processing means for generating recovered user data based on the user data signals and the first estimate.

In other features, the memory system includes second parameter estimation means for generating a second estimate of the signal quality value based on pilot signals that are generated based on pilot data stored in the block.

In other features, the detection means detects the defect based on the first estimate and the second estimate. In other features, the detection means detects the defect based on the first estimate and not the second estimate. In other features, the first estimate includes a signal-to-noise ratio value. In other features, the first estimate includes at least one of a mean value, a variance value, a standard deviation value, and a distance between mean values.

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3 illustrates an exemplary memory block that has pages with variable density, page length and/or overhead;

FIG. 4 illustrates an exemplary page that includes memory cells associated with a data portion and an overhead portion;

FIG. 5 illustrates an exemplary pilot location module;

DETAILED DESCRIPTION

Figure 1:
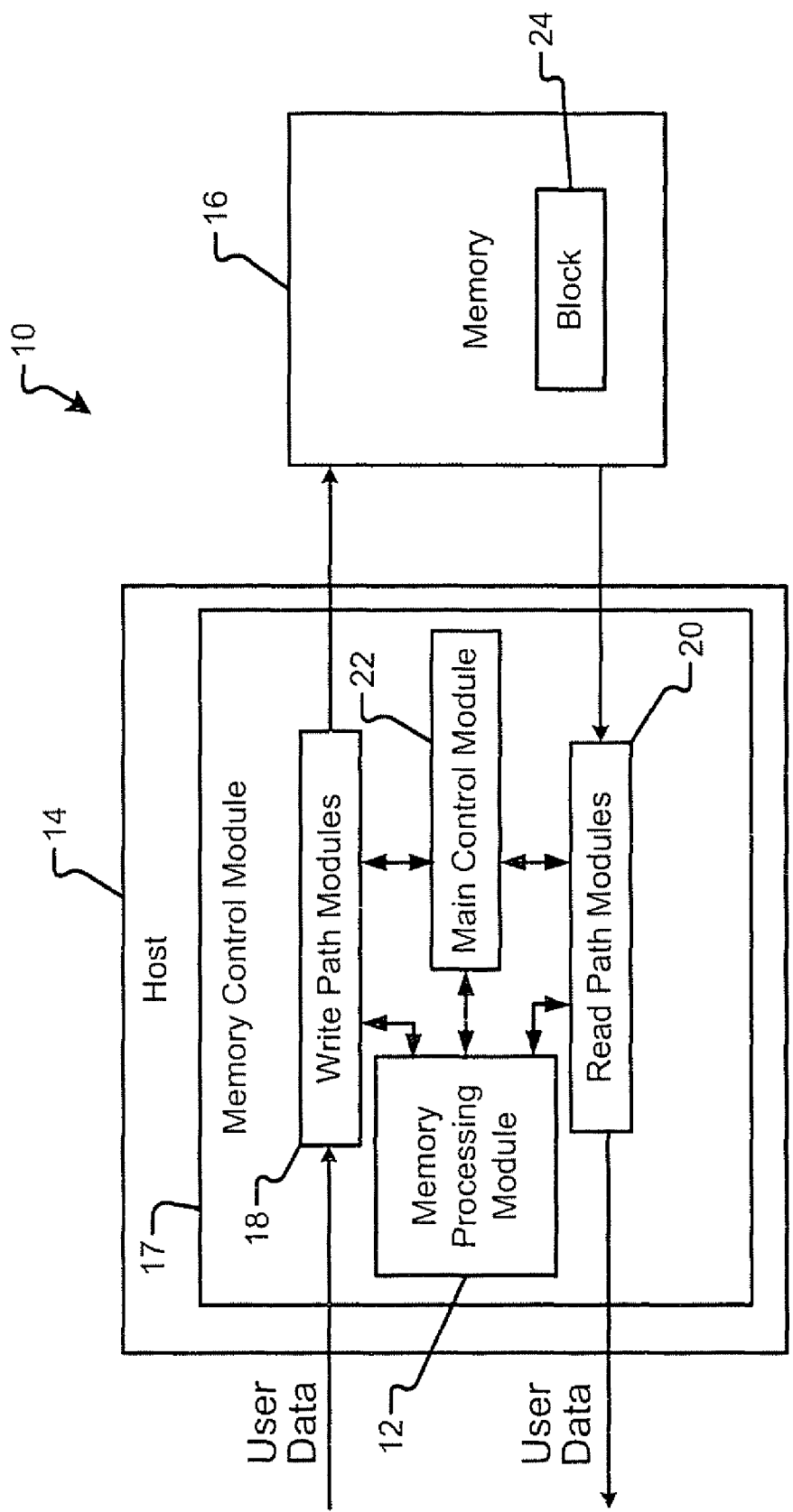
FIG. 1 is a functional block diagram of a memory system.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

In the following description many different embodiments are disclosed including various different aspects. The aspects described with respect to one embodiment are not specific to a single embodiment and may be applied to other embodiments of the present disclosure. In addition, the terms first and second are used arbitrarily. The terms may be interchanged based on the context and/or reference. The term defect refers to a flaw in one or more cells of a memory. Defect does not refer to an error in data stored in those cells. However, errors in data that is stored in the cells or in data recovered from the cells may be used to detect a defect associated with the cells.

A memory device may include non-volatile memory or volatile memory. The memory may include cache, solid-state memory, semiconductor memory, magnetic memory, memory integrated within a module or a stand-alone memory. Although the embodiments disclosed herein are primarily described with respect to non-volatile memory, the embodiments may be applied to volatile memory as well. A memory device may include hard or soft defects. The embodiments disclosed herein detect and determine the types of the defects. The soft defects may occur due to use and/or aging of the memory device over time.

A memory device may be arranged in a hierarchy having levels that are based on memory block size. Example levels in order of decreasing size include zones, sectors, pages, and/or arrays. A zone may include multiple sectors, which may each in turn include multiple pages. The pages may each include multiple arrays. Each array may contain any number of cells. A block of memory may refer to any portion of one or more of the stated levels.

In the following description, the term pilot data refers to predetermined data that is stored and/or generated by a system. The pilot data may include a predetermined data pattern that is stored during manufacture of the memory or during use of a memory. The data pattern is subject to similar disturbances and defects as other data stored in the memory. The pilot data may be generated during operation of a system via an algorithm. The algorithm may use stored and/or hard-coded values to generate the pattern. The pilot data may be stored in various locations in a memory device.

Pilot signals are generated when reading pilot data from a block of a memory device. A processing module may analyze the pilot signals based on the pilot data. The processing module may determine statistical parameters, such as signal quality parameters, which include signal parameters and noise parameters based on the analysis. The signal parameters may include mean values, distance between mean values, error count values, etc. The noise parameters may include signal-to-noise ratio (SNR) values, variance values, standard deviation values, and other disturbance values.

The statistical parameters may vary across different logical and physical pages and/or blocks of memory due to read/write cycling, manufacturing variations, and/or operating environment conditions. A processing module may determine the statistical parameters based on a comparison of a pilot signal to predetermined pilot information. Increasing the number of locations for pilot data may increase the accuracy of the determinations.

A physical page may be a grouping of memory cells having a hardwired size. A logical page may include formatted start and end-points within one or more physical pages. Logical pages may be used when data to be stored in memory has a length that differs from a length of a physical page. A logical page may be segmented and saved in multiple physical pages. A control module may set locations for storage of pilot data based on physical and/or logical page addressing.

Referring now to FIG. 1, a functional block diagram of a memory system 10 that includes a host 14 and memory 16. The host 14 includes a memory control module 17 with write path modules 18, read path modules 20, a main control module 22 and a memory processing module 12. The write path modules 18 write user data and/or pilot data to the memory 16. The read path modules 20 read user data and/or pilot data from the memory 16. The write and read path modules 18 and 20 may operate based on control signals from the main control module 22. The main control module 22 may include software and/or firmware for facilitating read and write functions of the memory system 10. The memory system 10 and the memory processing module 12 detect, identify and handle defective cells of the memory 16.

The memory processing module 12 may include software and/or firmware and determines statistical parameter values. Data is recovered based on the statistical parameter values. The statistical parameter values may be generated in association with a level of memory hierarchy, such as in association with a page or a block of a memory. This minimizes errors in the recovered data. The memory processing module 12 may also provide information to the main control module 22 and the write and read path modules 18 and 20 for updated system operation relative to the defective cells. The updated operation refers to how a defective cell is accessed based on a permitted access state. For example, the main control module 22 may not perform write and/or read tasks when accessing a defective cell based on the statistical parameter values generated by the memory processing module 12.

A block 24 of the memory 16 may wear out over time. The block 24 may wear out, for example, due to repeated writing and reading to and from the block 24. As the block 24 degrades from use, different status states may be assigned to that block 24. A first state may have a label of "Good" indicating that the block 24 may be used for both read and write tasks. A second state may have a label of "Average" indicating that data may be read from the block 24 and that data may not be written to the block 24. A third state may have a label of "Bad" indicating that the block 24 may not be used for read and write tasks. The described states are provided as examples; other states may be incorporated in the disclosed embodiments. The memory processing module 12 may provide the current state of each block of the memory 16 to the main control module 22 and/or the write and read path modules 18 and 20 to assist in blocks access control.

The memory 16 may include non-volatile or volatile memory. The memory 16 may be a solid state or semiconductor memory, such as RAM, ROM, flash memory, etc. The memory 16 may include magnetic memory.

Figure 2:
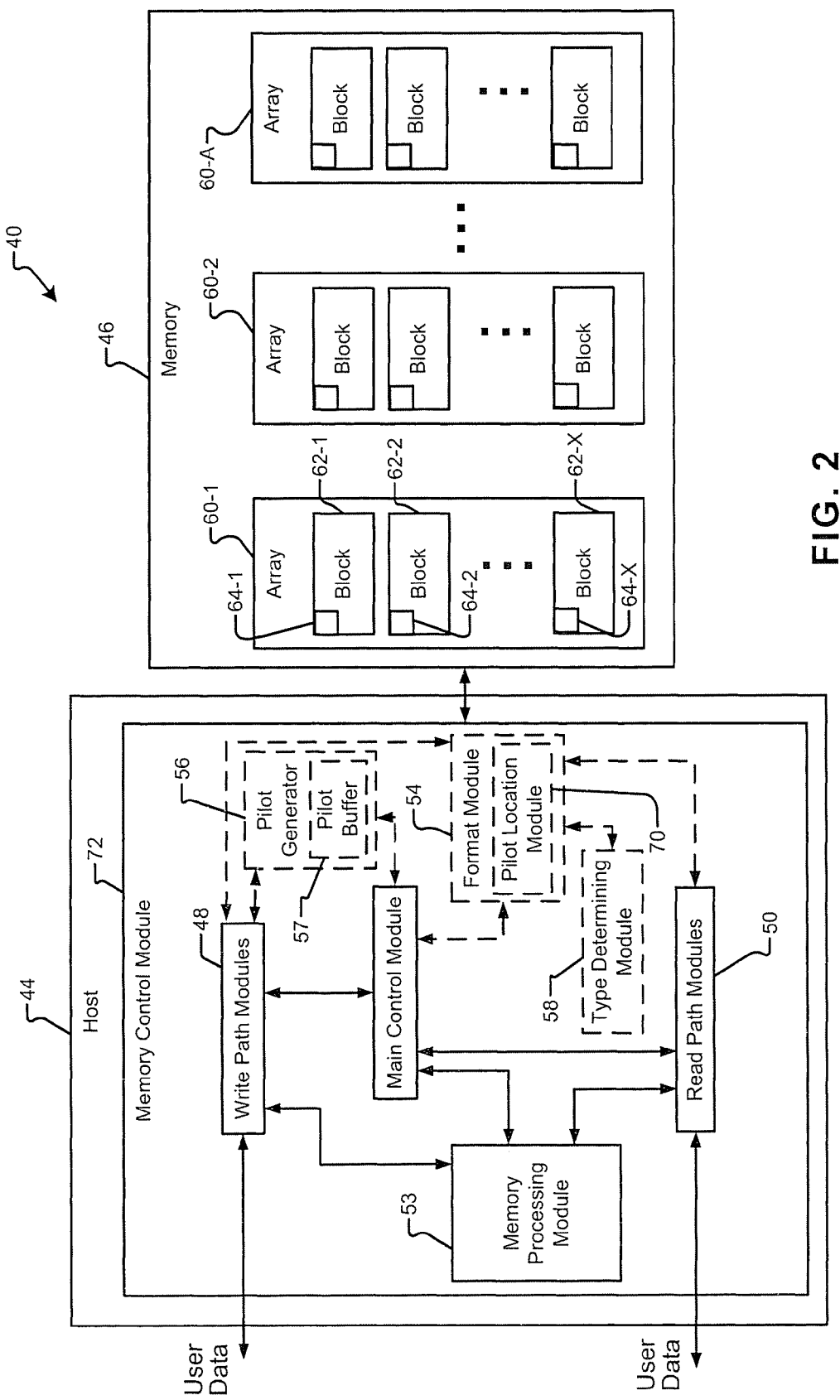
FIG. 2 is a functional block diagram of a memory system.

Referring now to FIG. 2, a functional block diagram of a memory system 40 is shown. The memory system 40 includes a host 44 and a memory 46. The host 44 includes a memory control module 47 with write path modules 48, read path modules 50, a main control module 52 and a memory processing module 53. The write path modules 48 write user data and/or pilot data to the memory 46. The read path modules 50 read user data and/or pilot data from the memory 46. The write and read path modules 48, 50 may operate based on control signals generated by the mean control module 52. The host 44 may also include a format module 54, a pilot generator 56, and a type determining module 58.

The memory processing module 53 may determine the statistical parameter values based on differences between the expected or predetermined pilot information and recovered pilot data. The recovered pilot data is obtained from pilot signals that are generated based on read signals generated when reading the cells of the memory 46, which contain the pilot data. These cells are referred to as pilot cells. The cells of the memory 46 that are associated with pilot data may be changed over time. In other words, the pilot data may not be stored in the same cells of the memory 46 during access to the memory 46.

The memory processing module 53 may include an algorithm that determines the statistical parameter values and may adapt the algorithm for subsequent read/write operations. In one embodiment, the memory processing module 53 reads from, writes to, and erases pilot information when user data is read, written, or erased in a corresponding block of the memory 46. This assures that the pilot cells experience similar usage degradation as the user data cells. Thus, statistical parameter values that are generated in association with the pilot cells are representative of signal quality and disturbance values associated with the user data cells.

The memory control module 47 may communicate with the memory 46 via the write and read path modules 48, 50. In one embodiment, the memory 46 includes non-volatile semiconductor memory. The memory 46 may include one or more arrays 60-1, 60-2, . . . , and 60-A of memory cells. The arrays 60 may be arranged in memory blocks 62-1, 62-2, . . . , and 62-X. The memory control module 47 may vary the number of memory cells per page or block in the memory 46. The memory control module 47 may vary the number of memory cells allocated for data and overhead portions of each page. The memory control module 47 may also determine locations for pilot data within the memory 46. The data stored in pilot cells 64-1, 64-2, . . . , and 64-X of the memory 46 may be predetermined data and may be reliably used to estimate signal, noise, and disturbance parameters.

The memory control module 47 may include the memory processing module 53, the format module 54, and/or the type determining module 58. The memory processing module 53 may determine statistical parameter values of cells in the memory 46. In use, the memory control module 47 writes pilot data to locations in the memory 46. The memory processing module 53 reads the data back and compares the read-back data to predetermined pilot information, which may be stored in the pilot generator 56.

The pilot generator 56 may be implemented as part of the write and read path modules 48 and 50, the main control module 52. The pilot generator 56 may also be implemented as a separate storage device as shown. The pilot generator 56 may be used to generate pilot data, which is stored in the memory 46. The pilot data may be generated and repeatedly altered. The pilot generator 56 may include a pilot buffer 57 and be used to store and/or generate predetermined pilot information, which may include or be used to generate predetermined pilot data that is the same as initially stored pilot data. The pilot information is compared with recovered pilot data from the memory 46 to determine statistical parameter values. The statistical parameter values may vary for each block of the memory 46.

The format module 54 may include a pilot location module 70 that sets locations for pilot data in the memory 46. The format module 54 may set locations for pilot data at a start, middle, and/or end of a physical page and/or a logical page. The format module 54 may also distribute locations for pilot data according to a predetermined pattern. Physical pages may be predefined and hardwired into the memory 46.

The format module 54 may format the memory 46 based on locations for pilot data. Formatting may include generating a memory map. Therefore, when data that is not pilot data is read from the memory 46, that data is stored in locations other than the locations for pilot data. The format module 54 may also adjust the memory map based on the signal processing algorithm. For example, when the memory processing module 53 determines that a portion of the memory 46 is damaged, the format module 54 may map the memory to discontinue use of that portion.

The type determining module 58 may be used to determine a type of memory that has been connected to the memory control module 47, such as the type of the memory 46. The type determining module 58 may use any method such as, but not limited to, communicating with the memory 46 and receiving configuration information. The configuration information may be stored in a setup portion of the memory 46 and have a standard or predetermined configuration. The memory control module 47 may read the setup portion and configure the rest of the memory 46.

Once the memory type is determined, the format module 54 may receive memory configuration information from the type determining module 58. Based on the information, the format module 54 may determine a predetermined arrangement of locations for pilot data for both physical and logical pages and/or blocks. The format module 54 may alternatively generate the locations for pilot data. The format module 54 may also determine the start and end of locations or addresses for each page and/or block, the density of memory cells, the number of error correction code or other overhead data (ECC/O) bytes per page, and generate the locations for pilot data based thereon.

The write and read modules 48, 50 write and read data to and from the memory 46 based on the memory configuration as determined by the format module 54. The write and read modules 48, 50 write and read data to and from locations associated with the pilot data and user data, as well as to other locations in the memory 46.

Referring now also to FIG. 3, an exemplary memory block 80 that includes pages 82-1, 82-2, ..., and 82-Q with variable density, page length and/or overhead is shown. The main control module 52 may vary the number of memory cells per page, the number of bits per memory cell, and/or the relative number of memory cells associated with the data portion and the overhead portion, respectively. Pilot data may be stored separately from the pages 82 or as part of each of the pages 82, as designated by pilot data 84 and pilot data 86-1, 86-2, ..., and 86-Q, respectively. The pilot data may be included as part of the overhead of each of the pages. The format module 54 may vary locations for pilot data based on the page structure determined by the main control module 52.

Referring now also to FIG. 4, an exemplary page 90 that includes memory cells associated with a data portion 92 and an overhead portion 94 is shown. The data portion 92 may include variable length/density (VL/D) cells, user data memory cells (MC), and/or other data cells. The overhead portion 94 may include VL/D cells, MC, pilot data cells, ECC/O cells, and/or other data cells.

Referring now also to FIG. 5, an exemplary pilot location module 100 is shown. The format module 54 may include a pilot location module that sets locations for pilot data in the memory 46. The pilot location module 100 may include a pilot program module 102 that programs predetermined patterns into locations of the memory 46 to facilitate fast acquisition of signal, noise and disturbance parameters.

The pilot location module 100 may set locations for pilot data in different locations relative to a physical page. For example, the pilot location module 100 may set locations for pilot data at the start, end and/or at a fixed segment, for example, in the middle of the physical page. The pilot location module 100 may also set locations for pilot data throughout the physical page in a predefined pattern, for example, evenly spaced throughout the physical page.

The pilot location module 100 may also set locations for pilot data in different locations relative to a logical page. For example, the pilot location module 100 may set locations for pilot data at the start, end, and/or at a fixed segment, for example, in the middle of the logical page. The pilot location module 100 may also set locations for pilot data throughout the logical page in a predefined pattern, for example, evenly spaced throughout the logical page.

Figure 6:
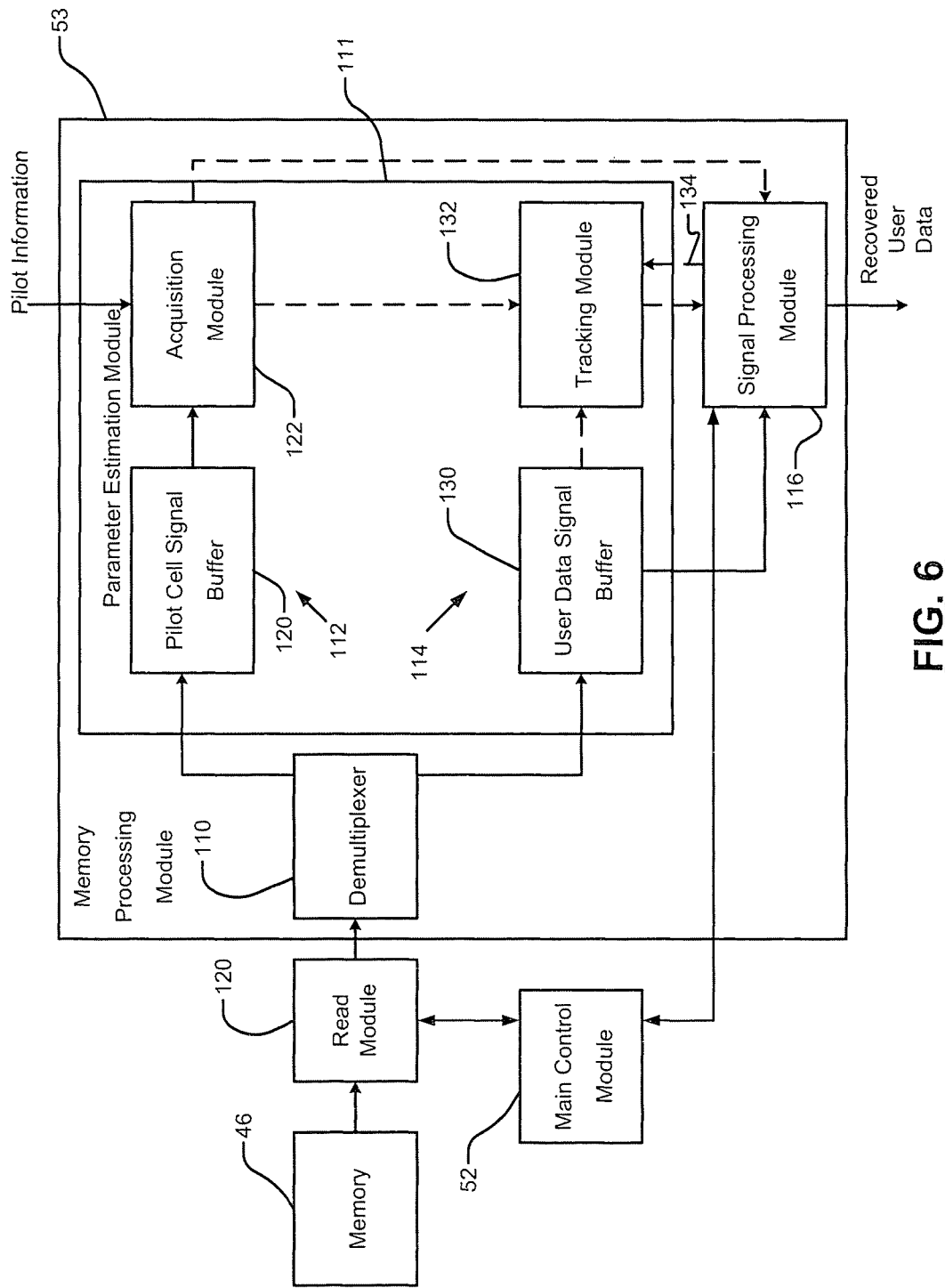
FIG. 6 is a functional block diagram illustrating the memory processing module of FIG. 2.

Referring now to FIG. 6, a functional block diagram illustrating the memory processing module 53 is shown. The memory processing module 53 includes a demultiplexer 110, a parameter estimation module 111 with an acquisition path 112 and a tracking path 114, and a signal processing module 116. A read module 120 accesses and reads data from the memory 46. The data is provided to the demultiplexer 110, which divides the data into parallel paths, the acquisition path 112 and the tracking path 114. The demultiplexer 110 generates pilot signals and user data signals based on the data read from the memory 46. The pilot signals are provided to the acquisition path 112 and the user data signals are provided to the tracking path 114.

The acquisition path 112 includes a pilot cell signal buffer 120 and an acquisition module 122. The pilot cell signal buffer 120 stores the pilot cell signals. The pilot cell signal buffer 120 may be a non-volatile or volatile storage device that is an integrated part of the memory processing module 53 or may be a separate storage device. The acquisition module 122 generates rough estimates of statistical parameter values associated with the pilot signals. The acquisition module 122 may be referred to as a first or second parameter estimation module. The rough estimates are representative of statistical parameter values associated with the user data signals for the corresponding block of memory that includes the pilot data.

In one embodiment, the acquisition module 122 generates a first estimate of SNR for the pilot signals. The pilot signals are compared with predetermined pilot information. The predetermined pilot information may be received from the pilot generator 56 of FIG. 2, generated by the memory processing module 53, or received from and/or generated by another module of the corresponding memory system.

A first least means squared (LMS) technique may be used to generate the first SNR estimate. The first LMS technique may be a high-speed high-bandwidth technique. The first LMS technique is an iterative technique that makes successive corrections to provide a minimum mean-square-error estimation. The LMS technique monitors Gaussian distributions of values associated with the pilot data to determine mean, variance, and standard deviation parameter values. As an example, the mean $m_p$ and variance $\sigma_p^2$ for the p-th signal level may be determined via the following set of equations:

$$m_p(k)=m_p(k-1)+\mu_m(r_p(k)-m_p(k-1)) \quad (1)$$

$$\sigma_p^2(k)=\sigma_p^2(k-1)+\mu_\sigma[(r_p(k)-m_p(k-1))^2-\sigma_p^2(k-1)] \quad (2)$$

The mean $m_p(k)$ and variance $\sigma_p^2(k)$ represent the mean and variance estimate after receiving the k-th signal sample for the p-th signal level, respectively; $m_p(k-1)$ and $\sigma_p^2(k-1)$ represent the previous mean and variance estimate, where $\mu_m$ and $\mu_\sigma$ are adaptation constants for the mean and variance estimates, respectively. Note that the range of p is determined by the number of signal levels for the flash cell as well as the pilot pattern. For example, for 2 bits per cell flash cell, where pilot patterns include all 4 possible signal levels, p takes the values between 0 and 3. After the mean and variance are estimated, an SNR value can be calculated based on the estimated values. For example an estimate of SNR can be defined as provided in equation 3.

$$SNR_1 = 10\log_{10}\left(\frac{d_1}{\sigma_1}\right)^2 \quad (3)$$

In equation 3, $d_1$ and $\sigma_1$ are the average of the distance between estimated means and standard deviations for all p. In other words, the distance $d_1$ may be as provided by equation 4 and the standard deviations $\sigma_1$ may be as provided by equation 5, where M is the total number of signal levels.

$$d_1 = \frac{1}{M-1} \sum_{i=0}^{M-2} (m_{i+1} - m_i) \quad (4)$$

$$\sigma_1 = \frac{1}{M} \sum_{i=0}^{M-1} \sqrt{\sigma_i^2} \quad (5)$$

The initial mean values $m_p(0)$ and variance values $\sigma_p^2(0)$ for p=0, ..., M-1 may be determined and/or provided based on the predetermined pilot information. The average variance $\sigma^2$ and SNR values may be continuously updated, stored and based on previously determined variance and SNR values. As the memory 46 is used, the mean estimate values $m_p$ and variance estimates $\sigma_p^2$ may change in position and/or magnitude.

A mean estimate value may be associated with each possible actual data value. For example, the possible values for two bits of data in binary are 00, 01, 10, and 11. A mean value may be generated that is associated with each of the possible two bit values for received data signals. The mean values represent the peaks of a distribution of recovered values about each of the possible data values. For example, zero (0)A may be associated with the bit value 00, where A is amperage. A distribution value range may be –0.5-0.5 mA with a peak at 0 mA. Similar distribution value ranges may exist for the other possible bit values. The distribution values may be based on voltages in stead of current values to provide voltage distributions.

As a memory cell is used, the distance d decreases and the standard deviation σ increases. Therefore, there may be increased overlap in distributions associated with each mean estimate value. Continuing from the above example, as the memory 46 is used, the range for bit value 00 may increase to –2-2 mA. Thus, depending on the adjacent bit value range, overlap between ranges may exist or be increased over use. Thus, the potential for error increases and the SNR decreases.

Output parameter estimates generated by the acquisition module 122 may be provided to the tracking path 114 and/or the signal processing module 116. When provided to the tracking path 114 further refinements in the parameters may be performed.

The tracking path 114 includes a user data signal buffer 130 and a tracking module 132. The user data signal buffer 130 receives and stores the user data signals that are based on encoded user data stored in the memory 46. The user data signal buffer 130 may include non-volatile and/or volatile storage devices that are an integrated part of the memory processing module 53 or may be a separate storage device. The tracking module 132 generates second estimates of statistical parameter values, including a second SNR estimate, associated with the user data signals. The tracking module 132 may be referred to as a first or second parameter estimation module. The second SNR estimate may be based on the first SNR estimate. In one embodiment, the second SNR estimate is based on the user data signals and not the first SNR estimate. This may occur when pilot data signals are not available.

A second LMS technique may be used to generate the second SNR estimate. The second LMS technique may be a low-speed low-bandwidth technique. The second LMS technique is also an iterative technique that makes successive corrections to provide a minimum mean square error. The second LMS technique monitors a distribution of values associated with the pilot data to determine mean, variance, and standard deviation values. The second LMS technique may be performed based on output estimates from the first LMS technique and through use of equations 6 and 7, where $\mu_m'$ and $\mu_\sigma$ are adaptation constants. It is customary to have $\mu_m' < \mu_m$ and $\mu_\sigma' < \mu_\sigma$ to achieve low-bandwidth adaptation. This affects the speed of the estimation.

$$m_p(k) = m_p(k-1) + \mu_m'(r_p(k) - m_p(k-1)) \quad (6)$$

$$\sigma_p^2(k) = \sigma_p^2(k-1) + \mu_\sigma'[(r_p(k) - m_p(k-1))^2 - \sigma_p^2(k-1)] \quad (7)$$

Similar to Eq. (2), a second estimate of the SNR can be estimated based on the adapted mean and variance values, viz.

$$SNR_2 = 10\log_{10}\left(\frac{d_2}{\sigma_2}\right)^2 \quad (8)$$

In equation 8, $d_2$ and $\sigma_2$ are the average of the distance between estimated means and standard deviations for all p.

The initial mean m variance $\sigma^2$ for Equations 6 and 7 may be set equal to the converged value determined by the acquisition module 122. Other statistical parameter values may also be provided from the acquisition module 122 to the tracking module 132.

As memory cells are used the distance $d_2$ decreases and the standard deviation $\sigma_u$ increases, thus there may be increased overlap in distributions associated with each mean estimate value. Thus, depending on the adjacent bit value range, overlap between ranges may exist or be increased. Thus, the potential for error increases and the second SNR estimate decreases.

The parameter values, such as the variance and SNR values, determined in the tracking module 132 may be based on the data recovered prior to or after ECC values determined in the signal processing module 116. This is referred to as decision feedback tracking. This accounts for errors in decoded user data signals. As shown, a decision feedback signal 134 may be provided from the signal processing module 116 to the tracking module 132.

The signal processing module 116 performs adaptive processing to generate recovered user data based on the user data signals, the first parameter values and/or the second parameter values. For low latency applications, the acquired parameters can be directly used by the signal processing module 116 by bypassing the fine-tuning process imposed by the tracking module 132. For latency insensitive applications, both the acquired and tracking parameters may be used.

As an example, when performing low-density parity-check (LDPC) decoding an estimate of variance, such as noise variance, is used. The estimate of variance generated in the acquisition module 122 or in the tracking module 132 may be used, depending upon system latency requirements. As another example, an estimate of SNR may be used when performing iterative decoding, such as during turbo code decoding.

Initial statistical parameter values, such as initial variance, SNR, and mean values, may be stored and used as reference values in comparisons with subsequently generated parameter values of the first and second LMS techniques. The initial parameter values may be stored in any one of the memories or modules disclosed herein or generated during operation of a memory system.

Figure 7:
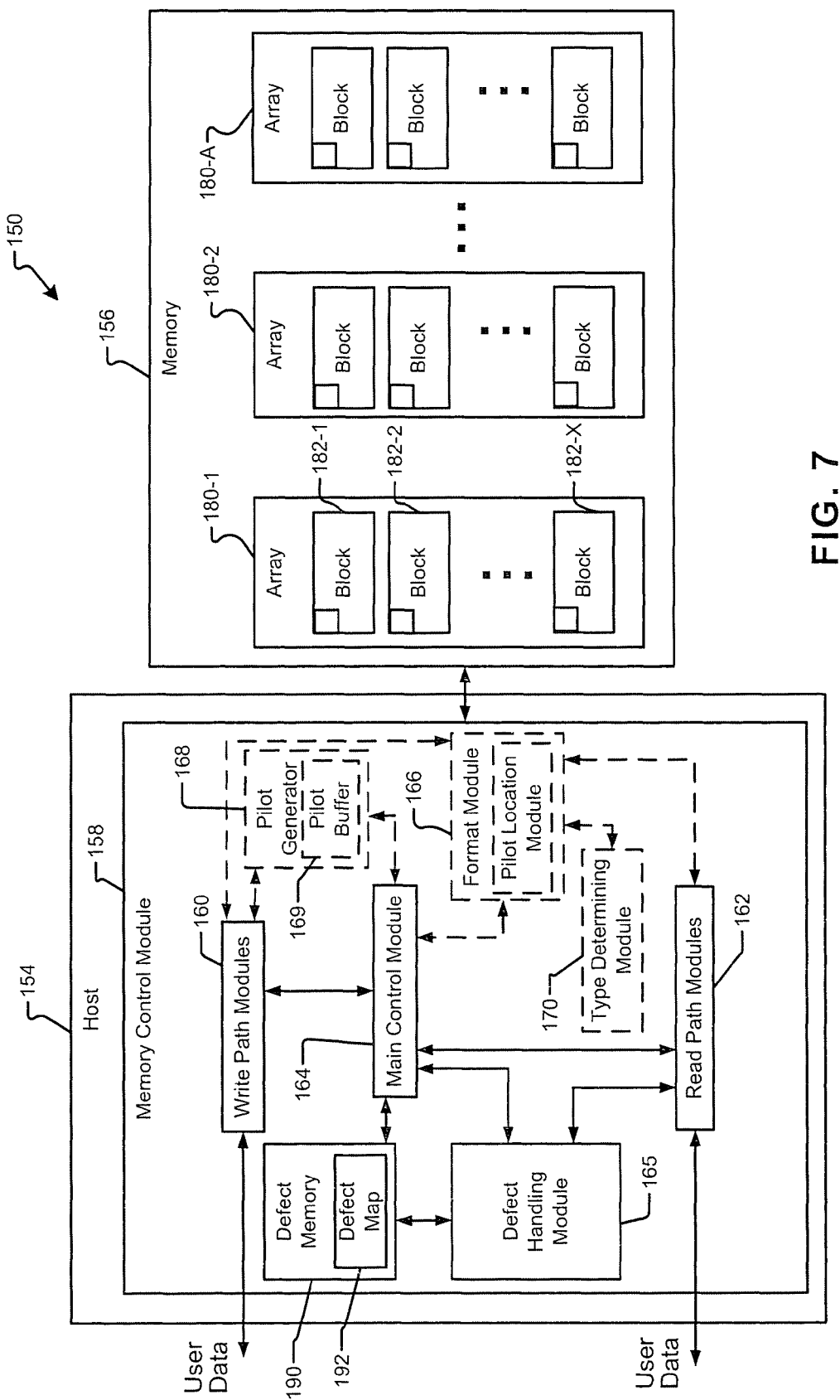
FIG. 7 is a functional block diagram of a memory system.

Referring now to FIG. 7, a functional block diagram of a memory system 150 is shown. The memory system 150 includes a host 154 and a memory 156. The host 154 includes a memory control module 158 with write path modules 160, read path modules 162, a main control module 164 and a defect handling module 165. The write path modules 160 write user data and/or pilot data to the memory 156. The read path modules 162 read user data and/or pilot data from the memory 156. The host 158 may also include a format module 166, a pilot generator 168 with a pilot buffer 169, and a type determining module 170.

The memory control module 158 may communicate with the memory 156 via the write and read path modules 160, 162. In one embodiment, the memory 156 is a non-volatile semiconductor memory. The memory 156 may include one or more arrays 180-1, 180-2, . . . , and 180-A of memory cells. The arrays 180 may be arranged in memory blocks 182-1, 182-2, . . . , and 182-X.

The defect handling module 165 in addition to generating statistical parameter values performs defect handling. A defect refers to a degraded aspect of a cell of the memory 156. Access to the memory 156 is adjusted based on predetermined and detected defects.

The defect information may be stored in a defect memory 190 that stores a defect map 192. The defect map 192 may include a defect state of each of the blocks of cell of the memory 156. The defect memory 190 may be incorporated in the memory control module 158, incorporated in another module, or be a separate memory device. For each block of the memory 156, the defect map 192 may include the following entries, a block identification (ID), a bock defect state, and one or more statistical parameter values associated with that block. The statistical parameter values may include variance values, SNR values, standard deviation values, etc. Other example statistical parameter values are disclosed herein. The information stored in the defect memory 190 may be available to the write and read modules 160, 162, the main control module 164, and/or other modules of a memory system.

Figure 8:
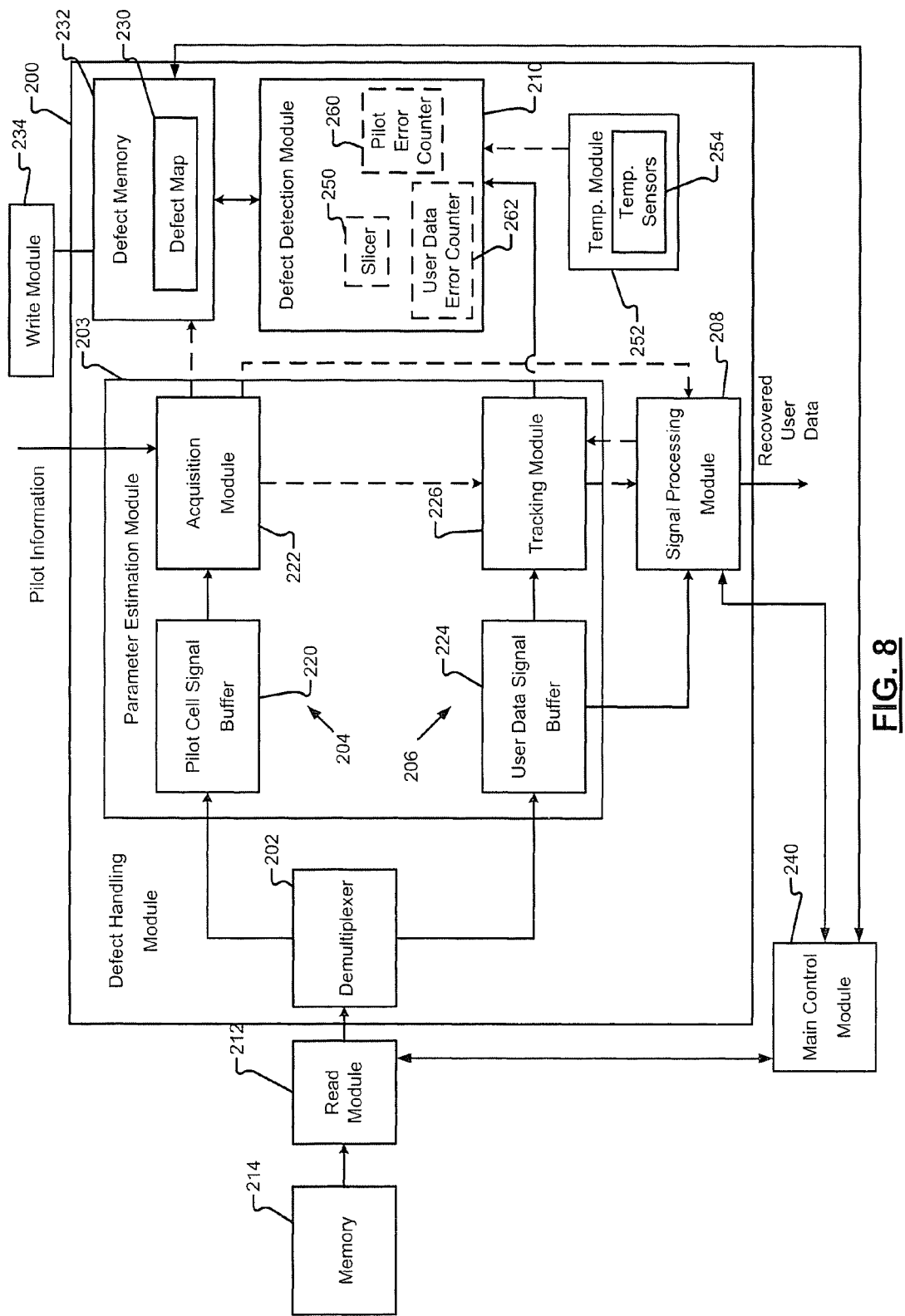
FIG. 8 is a functional block diagram illustrating an exemplary defect handling module.

Referring now to FIG. 8, a functional block diagram illustrating an exemplary defect handling module 200 is shown. The defect handling module 200 includes a demultiplexer 202, a parameter estimation module 203 with an acquisition path 204 and a tracking path 206, a signal processing module 208 and a defect detection module 210. A read module 212 accesses and reads data from a memory 214. The data is provided to a demultiplexer 202, which divides the data into parallel paths, the acquisition path 204 and the tracking path 206. The demultiplexer 202 generates pilot signals and user data signals based on the data read from the memory 214. The pilot signals are provided to the acquisition path 204 and the user data signal are provided to the tracking path 206.

The acquisition path 204 includes a pilot cell signal buffer 220 and an acquisition module 222. The pilot cell signal buffer 220 stores the pilot cell signals. The acquisition module 222 generates rough estimates of statistical parameter values associated with the pilot signals. In one embodiment, the acquisition module 222 generates a first estimate of SNR for the pilot signals. The pilot signals are compared with predetermined pilot information.

The first LMS technique may be used to generate the first SNR estimate, as described with respect to the embodiment of FIG. 6. The first LMS technique may be a high-speed high-bandwidth technique. The standard deviation σ and the SNR estimate may be determined via Equations 1, 2, and 3.

Output parameter estimates generated by the acquisition module 222 may be provided to the tracking path 206 and/or the signal processing module 208. When provided to the tracking path 206 further refinement in the parameters is performed.

The tracking path 206 includes a user data signal buffer 224 and a tracking module 226. The user data signal buffer 224 receives and stores the user data signals. The tracking module 226 generates a second estimate of statistical parameter values, such as a second SNR estimate, associated with the user data signals.

The second LMS technique may be used to generate the second SNR estimate, as described with respect to the embodiment of FIG. 6. The second LMS technique may be a low-speed low-bandwidth technique. The second LMS technique may be performed based on output estimates from the first LMS technique and through use of equations 6 and 7.

As the memory 214 is used, the statistical parameter values generated in the acquisition module 222 and the tracking module 226 may change. The defect detection module 210 receives the generated parameter values and detects changes therein and/or generates indicators based on the parameter values. The defect detection module 210 may detect, for example, the changes in variance, standard deviation, mean values, average distances between mean values, first and second SNR values, etc. In one embodiment, the first set of parameter values are generated based on the pilot signals and not based on the user data signals for defect detection. In another embodiment, a second set of parameter values are generated based on the user data signals and not based on the pilot signals for defect detection.

The parameters and differences may be stored in a defect map 230 of a defect memory 232. The differences may be stored and/or compared with predetermined threshold values and/or predetermined threshold ranges. Initial parameter values may be stored and used as reference values in comparisons with subsequently generated SNR values. The information stored in the defect memory 232 may be available to write and read module, such as a write module 234, the read module 212, a main control module 240, or other modules of a memory system.

When a parameter exceeds a threshold value or is outside of a threshold range, the defect detection module 210 may set a flag or change defect state of a page or block of cells associated with that parameter. Future use of the flagged cells may be restricted. As an alternative to using SNR values for defect detection and user data recovery, other parameter values may be used. In one embodiment, a defect flag is set when: A) a difference between an estimated mean value and a reference value exceeds a first threshold; B) a margin (distance) between estimated mean values is less than a second threshold; C) an estimated noise variance exceeds a third threshold; and any combination of A-C exists.

In one embodiment, when a first threshold value is exceeded, access to a corresponding block is limited to read and erase (remove) functions. When a second threshold is exceeded, access to a corresponding block is prevented.

As stated, when pilot signals are available, defect detection may be performed based on the pilot signals and/or the user data signals. As an example, the pilot and/or user data signals may be used to determine estimated SNR values, estimated signal parameters, estimated noise parameters, or a combination thereof.

Also, as the mean values shift, due to differences in current mean estimate values and the initial mean estimate value, performance of a memory decreases. This shift can be caused by leakage. A memory may include floating gates. Over time the ability of the floating gates to maintain a given charge decreases, thus the amount of charge that escapes increases. This changes the readout current from the floating gate significantly.

The defect map 230 may include a defect state of each block/page of the cells of the memory 214. The defect memory 232 may be incorporated in the memory processing module 200, incorporated in another module, or be a separate memory device. For each block of cell of the memory 214, the defect map 230 may include the following entries, a block identification (ID), a block defect state, and one or more statistical parameter values associated with that block including variance values, SNR values, standard deviation values, etc.

The defect detection module 210 may include a slicer 250. The slicer 250 may be used to compare a distribution magnitude value for a point between Gaussian distributions with a threshold. For example, the distribution magnitude in the middle of overlapped Gaussian distributions may be compared with a predetermined value to detect a defect.

The defect detection module 210 may handle defects based on any level of a hierarchy of a memory. A complexity, performance and memory capacity trade off exists when selecting a level of a memory hierarchy for the basis of defect handling. Complexity refers to the handling of defective and non-defective memory blocks and is associated with the size and number of the stated blocks. Performance refers to the speed in performing such handling. Memory capacity refers to the overall available storage space of a device after accounting for bad memory blocks. During defect handling, bad memory blocks are identified and subsequently no longer used. Thus, by selecting a high level of a memory hierarchy as a basis for defect handling complexity and memory capacity are substantially decreased whereas performance is increased. The larger the block of memory the higher the associated level of a memory hierarchy. On the other hand, when a low level of a memory hierarchy is selected complexity and memory capacity are minimally decreased whereas performance is decreased.

The defect detection module 210 may also provide early indications that a page or block of memory has potential defects or is experiencing degradation. The indications may be stored in the defect memory 232. The indications may provide a current level of degradation and/or an estimate of remaining life expectancy. This allows for replacement planning of the memory 214 and/or planned nonuse of one or more blocks of the memory.

In one embodiment, and in association with a non-volatile semiconductor memory such as flash memory, when a block of memory is identified as defective, data recovered from that block is stored in another block. The recovered data may be stored in another block in the same or in a different memory. Future access to the defective block for read, write and erase tasks is prevented. In another related embodiment, and also in association with a non-volatile semiconductor memory such as flash memory, when a block of memory is identified as defective, the current block may be identified as average or as a read only block. Future write and erase tasks with respect to the defective block are prevented. Write and erase tasks can degrade a block of memory quicker than and/or in a more noticeable manner than read tasks.

The defect detection module 210 may also determine defective memory blocks based on dynamic parameters and thresholds. A dynamic parameter may refer to an ambient temperature, a memory system temperature, a current number of read and write cycles, an average estimate of SNR, etc. A dynamic threshold may refer to an ambient temperature threshold, a memory system temperature threshold, a maximum number of read and write cycles, an average number of read and write cycles of a block associated with a level of degradation, an average estimate of SNR, etc. The dynamic parameters and thresholds may be stored in the defect memory or in other memories, storage devices and/or modules disclosed herein. The temperature values may be determined via a temperature module 252. The temperature module 252 may include or perform as one or more temperature sensors 254.

In one embodiment, to simplify processing, the defect detection module 210 detects defects based on a number of symbol errors associated with the pilot data and/or the user data. When the number of symbol errors exceeds a predetermined threshold, a defect is detected. When associated with the pilot data, a pilot error counter 260 may be used to count differences between pilot data signals and predetermined pilot information. When associated with user data, a user data error counter 262 may be used. The value of the user data error counter 262 may be provided based on decoding performed by the signal processing module 208. The signal processing module 208 generates recovered user data based on the user data signals, the first parameter values and/or the second parameter values.

Figure 9:
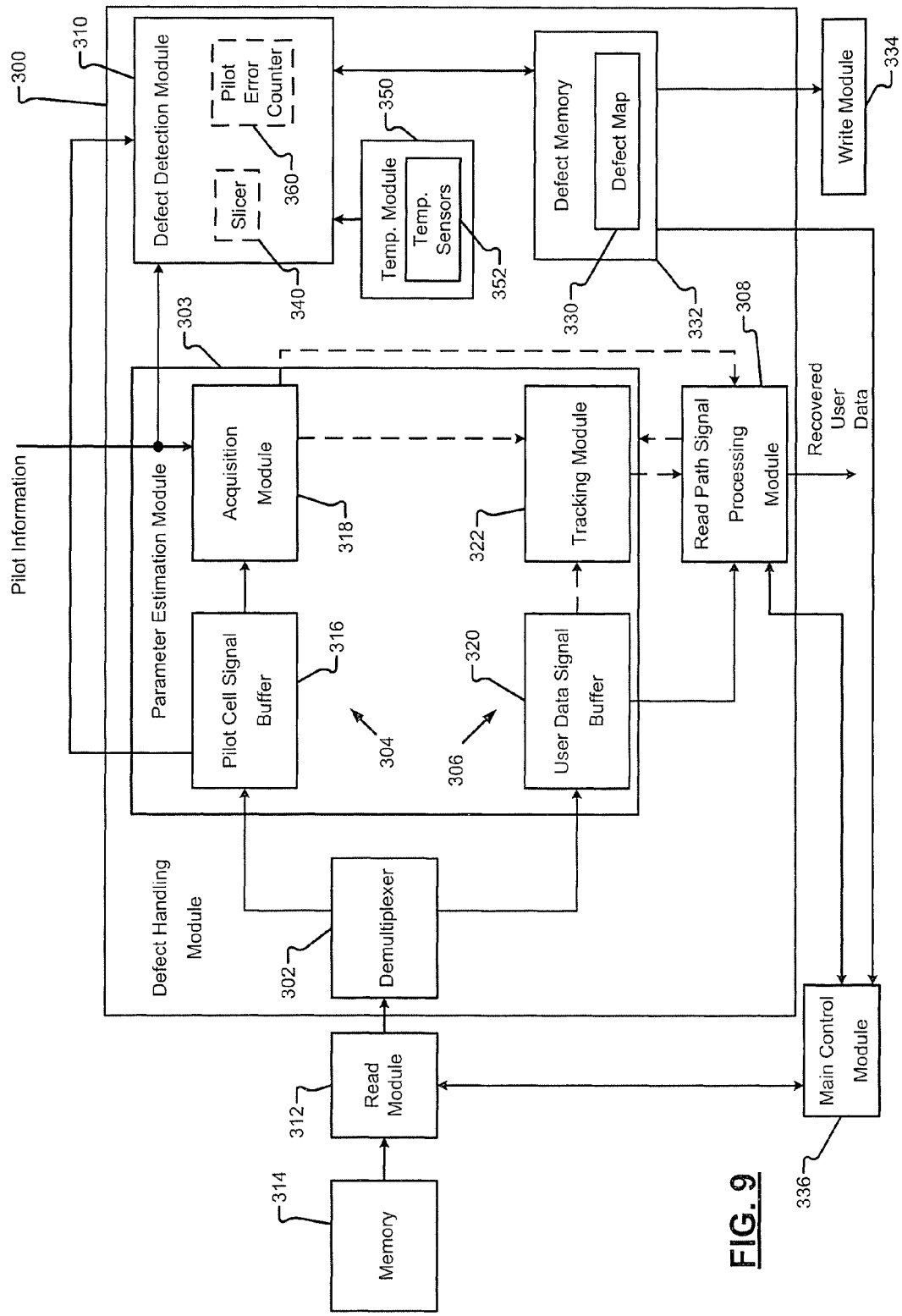
FIG. 9 is a functional block diagram illustrating an exemplary defect handling module.

Referring now to FIG. 9, a functional block diagram illustrating an exemplary defect handling module 300 is shown. The defect handling module 300 includes a demultiplexer 302, a parameter estimation module 303 with an acquisition path 304 and a tracking path 306, a signal processing module 308 and a defect detection module 310. A read module 312 accesses and reads data from a memory 314. The data is provided to the demultiplexer 302, which divides the data into parallel paths, the acquisition path 304 and the tracking path 306. The demultiplexer 302 generates pilot signals and user data signals based on the data read from the memory 314. The pilot signals are provided to the acquisition path 304 and the user data signals are provided to the tracking path 306.

The acquisition path 304 includes a pilot cell signal buffer 316 and an acquisition module 318. The pilot cell signal buffer 316 stores the pilot cell signals. The acquisition module 318 generates rough estimates of statistical parameter values associated with the pilot signals. In one embodiment, the acquisition module 318 generates a first estimate of SNR for the pilot signals. The pilot signals are compared with predetermined pilot information.

The first LMS technique may be used to generate the first SNR estimate, as described with respect to the embodiment of FIG. 6. The first LMS technique may be a high-speed high-bandwidth technique. The standard deviation $\sigma$ and the SNR estimate may be determined via Equations 1, 2 and 3.

Output parameter estimates generated by the acquisition module 318 may be provided to the tracking path and/or the signal processing module 308. When provided to the tracking path 306 for further refinement of the parameters.

The tracking path 306 includes a user data signal buffer 320 and a tracking module 322. The user data signal buffer 320 receives and stores the user data signals. The tracking module 322 generates a second estimate of statistical parameter values, such as a second SNR estimate, associated with the user data signals.

The second LMS technique may be used to generate the second SNR estimate, as described with respect to the embodiment of FIG. 6. The second LMS technique may be a low-speed low-bandwidth technique. The second LMS technique may be performed based on output estimates from the first LMS technique and through use of equations 6, 7 and 8.

The defect detection module 310 detects defects in blocks of the memory 314 based on the pilot signals and predetermined pilot information. The defect detection module 310 may perform similar tasks as the defect detection module 210 of FIG. 8. The defect detection module 310, however, operates based on pilot data not user data.

The defect detection module 310 may also provide early indications that a page or block of memory has potential defects or is experiencing degradation. The indications may provide a current level of degradation and/or an estimate of remaining life expectancy. Recovered user data may be stored in different memory blocks based on detected defects. Different defect identifications may be associated with monitored blocks of the memory. Future use of the blocks may be limited based on the associated defective states.

The defect detection module 310 compares the pilot signals to the predetermined pilot information to count the number of errors in the pilot signals. The number of errors, the above-stated indications and identifications, and/or other parameters may be stored in a defect map 330 of a defect memory 332. The information stored in the defect memory 332 may be available to the write and read modules, such as the read module 312 and a write module 334, a main control module 336, or other modules of a memory system.

The defect map 330 may include a defect state of each block of the cells of the memory 314. The defect memory 332 may be incorporated in the memory control module 300, incorporated in another module, or be a separate memory device. For each block of cell of the memory 314, the defect map 330 may include the following entries, a block identification (ID), a block defect state, a number of errors associated with that block, etc.

The defect detection module 310 may include a slicer 340. The slicer 340 may be used to compare a distribution magnitude value for a point between Gaussian distributions with a threshold. When a number of pilot errors associated with a block of cells exceeds a threshold, precautious measures may be taken, some of which are described herein.

The defect detection module 310 may also determine defective memory blocks based on dynamic parameters and thresholds. The dynamic parameters may include ambient temperature, memory system temperature, a current number of read and write cycles, etc. The dynamic thresholds may include an ambient temperature threshold, a memory system temperature threshold, a maximum number of read and write cycles, an average number of read and write cycles of a block associated with a level of degradation, etc. The dynamic parameters and thresholds may be stored in the defect memory 332 and/or one of the memories, storage devices and/or modules disclosed herein. The temperature values may be determined via a temperature module 350, which may perform as or include one or more temperature sensors 352.

In one embodiment, to simplify processing, the defect detection module 310 detects defects based on a number of symbol errors associated with the pilot data. When the number of symbol errors exceeds a predetermined threshold, a defect is detected. A pilot error counter 360 may be used to count differences between pilot data signals and predetermined pilot information.

The signal processing module 308 generates recovered user data based on the user data signals, the first parameter values and/or the second parameter values from the acquisition and tracking modules 318, 322.

Figure 10:
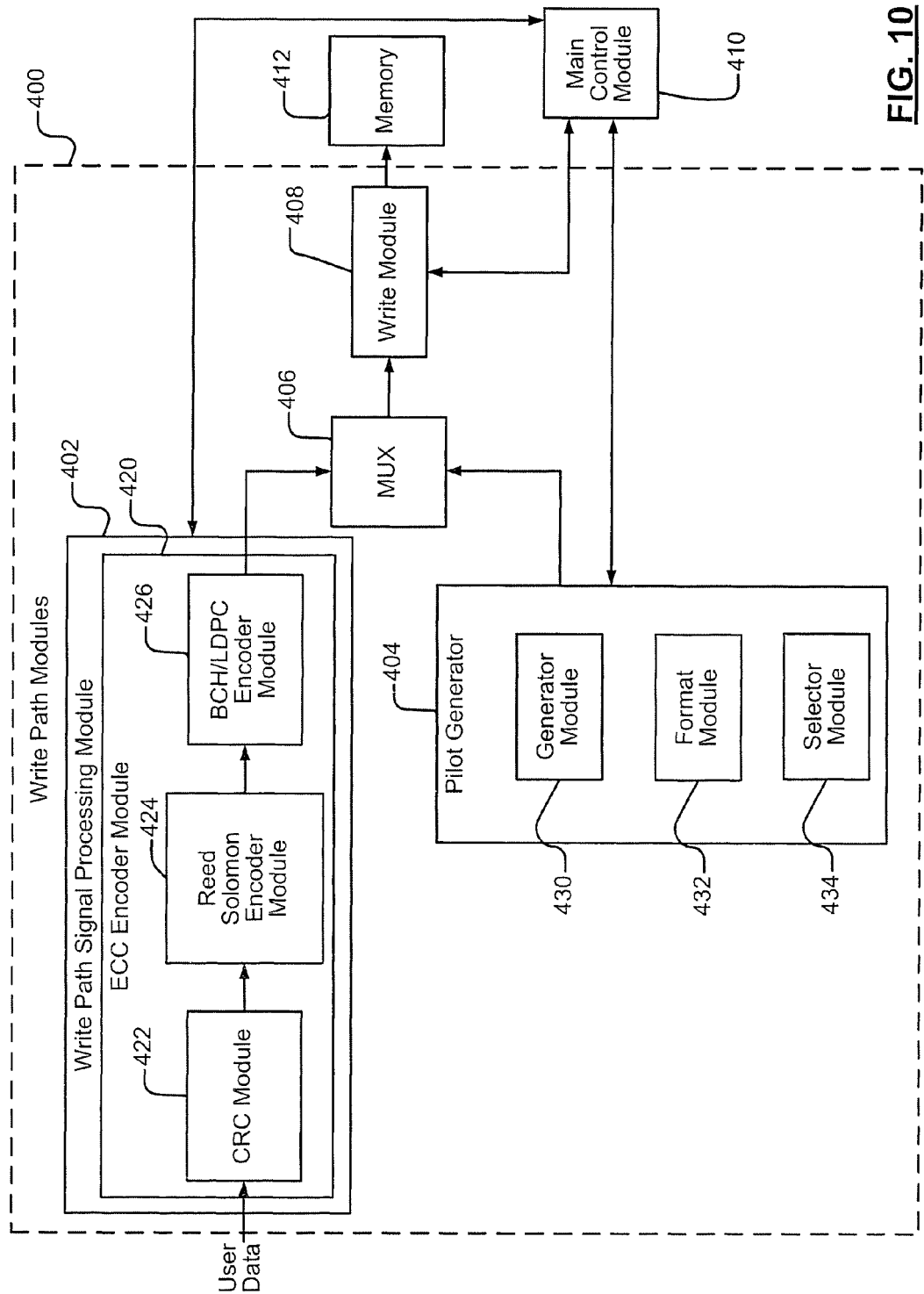
FIG. 10 is a functional block diagram of write path modules.

Referring now to FIG. 10, a functional block diagram of write path modules 400 is shown. The write path modules 400 include a write path signal processing module 402, a pilot generator 404, a multiplexer 406, and a write module 408. The write path signal processing module 402 and the pilot generator 404 are in communication with a main control module 410. The main control module 410 generates pilot data when the user data is received and written to a memory 412. This assures that the condition of the pilot cells of the memory 412 is representative of user data cells of the memory 412.

The write path signal processing module 402 may have an ECC encoder module 420 that encodes an overhead portion of the memory 412. The ECC encoder module 420 may include a cyclic redundancy (CRC) module 422 that generates CRC bits based on user data. The ECC encoder module 420 may include other encoding modules. For example, a Reed Solomon encoder module 424 of the ECC encoder module 420 may perform Reed Solomon encoding based on CRC module signals. A Bose-Chaudhuri-Hocquenghem (BCH)/LDPC encoder module 426 of the ECC encoder module 420 may perform either BCH or LDPC encoding based on Reed Solomon encoder module signals. Various other encoding modules may also be used.

The pilot generator 404 may include a generator module 430, a format module 432 and a selector module 434. The generator module 430 selectively generates pilot data. The format module 432 that may set cell locations in the memory 412 for the pilot data. The format module 432 may set locations for pilot data at a start, middle, and/or end of a physical page and/or a logical page. The format module 432 may also set locations for pilot data according to a predetermined pattern. The selector module 434 selects one of a plurality of sequences of pulse amplitude modulated (PAM) levels for writing to pilot cells. The selector module 434 may randomly select a sequence or may alternate between sequences.

The multiplexer 406 receives and selectively combines the encoded user data from the ECC encoder module 420 and the pilot data. The combination may be based on the aforementioned sequences and PAM operations. The multiplexer 406 selectively outputs the combined pilot and user data in a data stream to the write module 408 that stores the data in the memory 412.

For example only, during write operations, the selector module 434 may select from two or more sequences for a first write operation. The two sequences may be referred to as sequence A and sequence B. The sequences may have predefined lengths or alternatively may have lengths that are based on the number of pilot cells that will be written to for a particular page or block of the memory 12. The selector module 434 alternates between sequences A and B in subsequent write operations. Write operations may include writing to one or more cells of the memory 412.

In other words, for a first write operation, sequence A may be selected to write multiple cells of the memory 412. For a second write operation, sequence B may be selected to write to multiple cells (that may or may not be the same cells as those written to using sequence A). The selector module 434 may make subsequent selections of sequences based on complete or partial write operations to groups of memory cells. The selector module 434 need not complete sequence A before selecting sequence B.

The multiplexer 406 combines pilot data and user data (encoded data stream) to be written to the memory 412. The combination may be based on the selected sequence and may fix positions of the pilot data for each logical page.

In flash memory, different cell levels may have correspondingly different voltage characteristics. The first and last cell levels may have substantially different voltage characteristics, whereas intermediate levels may have relatively similar voltage characteristics. For example, an 8 level cell may include levels 0-7. The lowest level (level 0) and highest level (level 7) may have unique characteristics while levels 1-6 may have similar characteristics.

The selector module 434 may select sequences that instruct write operations to write to as few levels as possible. The selector module 434 may therefore select a sequences that includes writing to level 0 and level 7 and two of the intermediate levels (for example levels 2 and 5). Voltage characteristics of the unselected levels (levels 1, 3, 4, 6) may be determined via interpolation and based on levels 2 and 5 because levels 1-6 have similar voltage characteristics. The selector module 434 sequences may therefore select 4 levels that may provide write/read-back characteristics of an entire cell or group of cells regardless of the number of possible levels. However, the present disclosure is not limited to 4 levels, and any or all levels may be used.

The following paragraph indicates 4 exemplary levels used for 8PAM signaling, 12PAM signaling, and 16PAM signaling (non-normalized) signaling. For 8PAM, the selector module 434 selects a sequence that includes signal levels 0, 1, 4, and 7. For 12PAM, the selector module 434 selects a sequence that includes signal levels 0, 1, 6 and 11. For 16PAM, the selector module 434 selects a sequence that includes signal levels 0, 1, 8 and 15. For 32PAM, the selector module 434 selects a sequence that includes pilot levels 0, 1, 16 and 31.

The selector module 434 may select from exemplary sequences A and B. A read path may determine whether sequence A or B is used based on the levels of the first 3 pilot cells that have been written to and are detected.

For sequence A, level 0 is written to for the first 3 pilot cells, while for Scheme B, the highest level may be written for the first 3 pilot cells. The highest level may be 7 for 8PAM, 11 for 12PAM and 15 for 16PAM, respectively. Subsequent pilot levels of sequence A are used in a cyclical pattern that includes the four levels selected. Subsequent pilot levels of sequence B may be a cyclical shift of the pilot levels of sequence A. For example, for 8PAM signaling, sequence A: 0 0 0 1 4 7 0 1 4 7 0 1 4 7 . . . , and sequence B: 7 7 7 4 1 0 7 4 1 0 7 4 1 0 . . . . Sequences A and B are not required to be cyclically shifted but may merely differ in other ways. Sequences A and B are selected so that the read module can easily distinguish between them. In the above example, the read module may do a majority of the decoding on the first three cells to decide whether the pilot sequence A or B is used. Therefore, the write module does not need to explicitly tell the read module which sequence is used.

The format module 432 may set locations for the pilot data that do not depend on the PAM for the memory cells. Alternatively, the multiplexer module 141 may insert pilot data into user data as a function of the PAM of the memory cells. For example, there may be 512 cells in for pilot data per sector of size 33 KB. Thus, for each physical page of 2 KB+64B, 32 cells are allocated for pilot data. In the following, the frequency of pilot cells appearing in the flash memory device is computed for 8PAM, 12PAM, 16PAM and 32PAM.

For 8PAM signaling, there may be 5632 cells per physical page. Therefore, every 176 cells may contain one pilot cell. Every 176*3=528 bits may contain 3 pilot bits. For 12PAM signaling, there may be 2414 cell-pairs/physical page. Therefore, every 150 cell-pairs may contain one pair of pilot cells. Every 150*7=1050 bits may contain 7 pilot bits. For 16PAM signaling, there may be 4224 cells per page. Every 132 cells may contain one pilot cell. Every 132*4=528 bits may therefore contain 4 pilot bits. For 32PAM signaling, there may be 3380 cells per page. Every 105 cells may contain one pilot cell. Every 105*5=605 bits may therefore contain 5 pilot bits.

Figure 11:
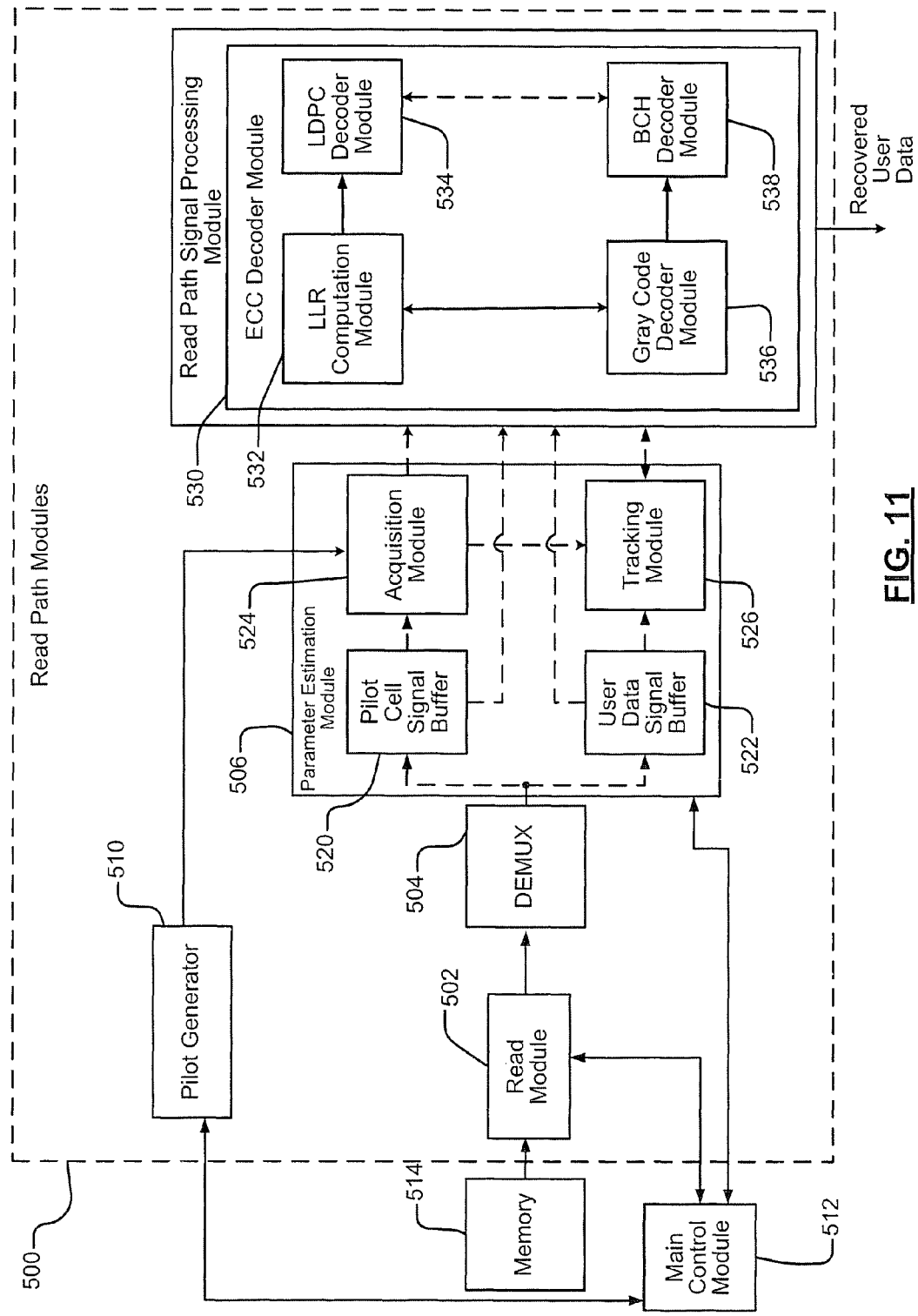
FIG. 11 is a functional block diagram of read path modules.

Referring now also to FIG. 11 is a functional block diagram of read path modules 500 is shown. The read path modules 500 include a read module 502, a demultiplexer 504, a parameter estimation module 506, a signal processing module 508, and a pilot buff/generator 510. The read module 502, the parameter estimation module 506 and the pilot generator 510 are in communication with a main control module 512. The main control module 512 signals the pilot generator 510 to read pilot data when user data is read from a memory 514. This further assures that the condition of the pilot cells is representative of the user data cells.

The read module 502 reads user data and pilot data from the memory 514. The demultiplexer module 204 receives and demultiplexes the user data and pilot signals. A pilot cell signal buffer 520 receives pilot signals and a user data signal buffer 522 receives user data signals. An acquisition module 524 receives an output of the pilot cell signal buffer 520. A tracking module 526 may receive output of the user data signal buffer 522 and output of the acquisition module 524. The outputs of the parameter estimation modules 520-526 may be provided to an ECC decoder module 530 of the signal processing module 508.

An ECC decoder module 530 decodes the read-back signals that were partially encoded by the ECC encoder module 420. The ECC decoder module 530 may include a log-likelihood ratio (LLR) computation module 532, a LDPC module 534, a Gray Code decoder module 536, and a BCH decoder module 538. Outputs of the parameter estimation modules 520-526 may be provided to the LLR computation module 532 and/or the gray code decoder module 536. The LDPC decoder module 534 may receive LLR output data from the LLR computation module 532. The BCH decoder 538 may receive LDPC outputs from the LDPC decoder module 534 and/or binary outputs from the Gray code decoder module 536. Finally, the outputs of the LDPC decoder module 534 and/or the BCH decoder module 538 may further be decoded by a Reed-Solomon decoder and subsequently checked by a CRC decoder to provide recovered user data.

The read path modules 500 may read back data from the memory 514 in analog or binary form as an analog or binary signal. If the signal is binary, the demultiplexer 504 demultiplexes the pilot bits from the input user data, and the user data is directly sent to the Gray code decoder module 536. When the signal is analog, the user data and pilot data are processed with adaptive signal processing algorithms.

When data is LDPC coded, the output from the tracking module 526 in combination with the original user data are used by the LLR computation module 532 to calculate log-likelihood ratios. Otherwise, the Gray code decoder module 536 translates the output from the tracking module 526 into coded binary bits for the BCH decoder 538.

Figure 12:
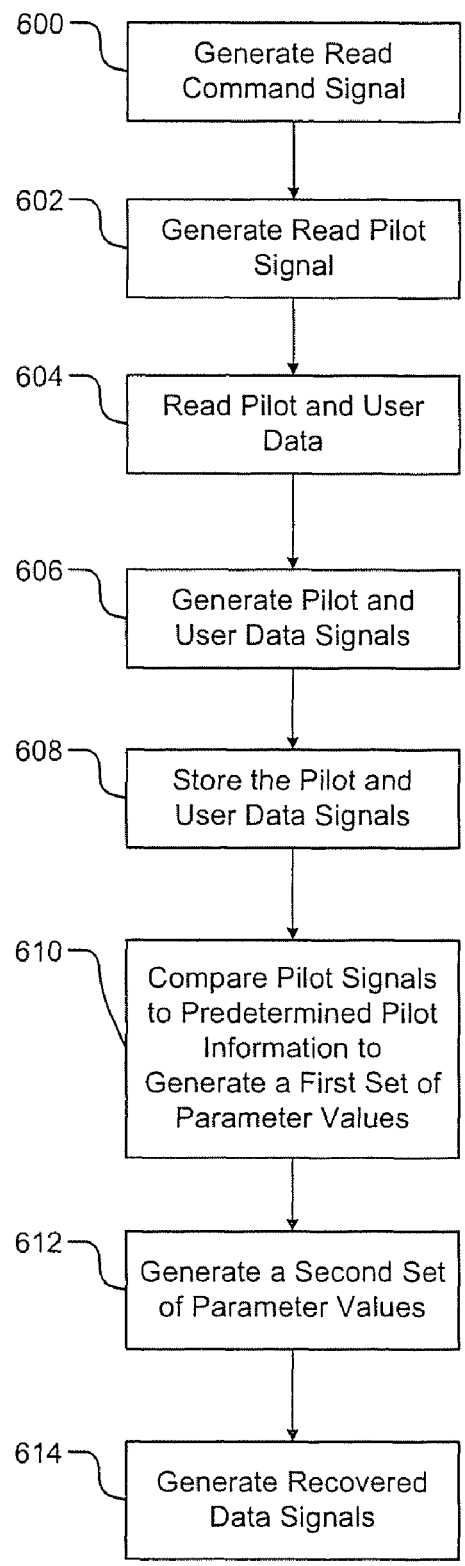
FIG. 12 is a logic flow diagram illustrating a method of operating a memory processing module.

Referring now to FIG. 12, a flow diagram illustrating a method of operating a memory processing module is shown. Although the following steps are described primarily with respect to the embodiment of FIGS. 2 and 6, the steps may be applied to other embodiments of the present disclosure.

In step 600, a command signal is generated to read user data from a block of a memory. In step 602, a read pilot signal is generated based on the command signal. In step 604, pilot data and user data is read from the block. The pilot data and the user data may be provided to a demultiplexer, such as by one of the demultiplexers disclosed herein, as a read signal.

In step 606, pilot data signals and user data signals are generated based on the read signal. In step 608, the pilot signals are stored in a pilot cell signal buffer, such as one of the pilot cells signal buffers disclosed herein. The user data signals are stored in a user data signal buffer, such as one of the user data signal buffers disclosed herein.

In step 610, the pilot signals and corresponding pilot information is provided to an acquisition module. The acquisition module generates one or more statistical parameter values based on the pilot signals and the pilot information. This may be referred to as a first set of parameter values. The first set of parameter values may be rough estimate values.

In step 612, a tracking module generates a second set of parameter values based on the first set of parameter values and/or the user data signals. The tracking module may generate the second set of parameter values based on a decision feedback tracking signal. The tracking module may also generate the second set of parameter values based on the user data signals and not based on the first set of parameter values.

When applied to a low latency application, the first set of parameter values are provided to the tracking module. When applied to a latency insensitive application, the first set of parameter values is provided to a signal processing module.

In step 614, the signal processing module generates recovered user data based on the second set of parameter values and the user data signals. Alternatively, the signal processing module generates recovered user data based on the first set of parameter values and the user data signals.

Figure 13:
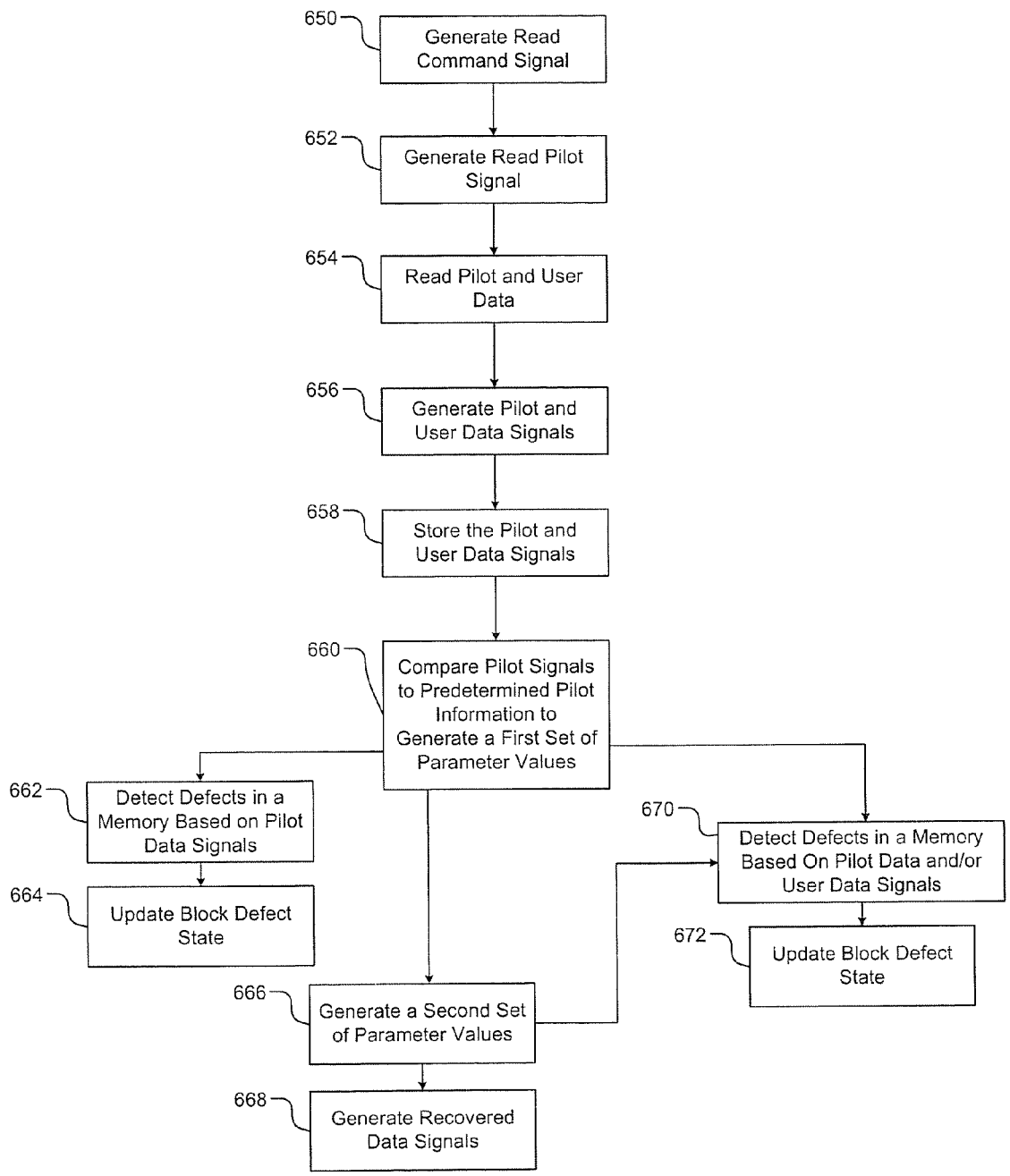
FIG. 13 is a logic flow diagram illustrating a method of operating a memory processing a defect handling module.

Referring now to FIG. 13, a flow diagram illustrating a method of operating a memory processing a defect handling module is shown. Although the following steps are described primarily with respect to the embodiment of FIGS. 7-9, the steps may be applied to other embodiments of the present disclosure.

In step 650, a command signal is generated to read user data from a block of a memory. In step 652, a read pilot signal is generated based on the command signal. In step 654, pilot data and user data is read from the block. The pilot data and the user data may be provided to a demultiplexer, such as by one of the demultiplexers disclosed herein, as a read signal.

In step 656, pilot data signals and user data signals are generated based on the read signal. In step 658, the pilot signals are stored in a pilot cell signal buffer, such as one of the pilot cells signal buffers disclosed herein. The user data signals are stored on a user data signal buffer, such as one of the user data signal buffers disclosed herein.

In step 660, the pilot signals and corresponding pilot information is provided to an acquisition module. The acquisition module generates one or more statistical parameter values based on the pilot signals and the pilot information. This may be referred to as a first set of parameter values. The first set of parameter values may be rough estimate values.

In step 662, a defect detection module may detect one or more defects in the block based on the first set of parameter values, the pilot signal values, and/or predetermined pilot information. The defects may be detected based on additional dynamic parameter values, such as those described herein.

In step 664, the defect detection module may update defect state of the block and corresponding cells in a defect memory, as well as store the first set of parameter values.

In step 666, a tracking module generates a second set of parameter values based on the first set of parameter values and the user data signals. The tracking module may generate the second set of parameter values based on a decision feedback tracking signal. The tracking module may also generate the second set of parameter values based on the user data signals and not based on the first set of parameter values.

When applied to a low latency application, the first set of parameter values are provided to the tracking module. When applied to a latency insensitive application, the first set of parameter values is provided to a signal processing module In step 668, the signal processing module generates recovered user data based on the second set of parameter values and the user data signals. Alternatively, the signal processing module generates recovered user data based on the first set of parameter values and the user data signals.

In step 670, a defect detection module may detect one or more defects in the block based on the first and/or second set of parameter values. The defects may be detected based on additional dynamic parameter values, such as those described herein.

In step 672, the defect detection module may update defect state of the block and corresponding cells in the defect memory, as well as store the first and second set of parameter values.

The above-described steps of FIGS. 12 and 13 are meant to be illustrative examples; the steps may be performed sequentially, synchronously, simultaneously, continuously, during overlapping time periods or in a different order depending upon the application.

Referring now to FIGS. 14A-14G, various exemplary implementations incorporating the teachings of the present disclosure are shown.

Figure 14A:
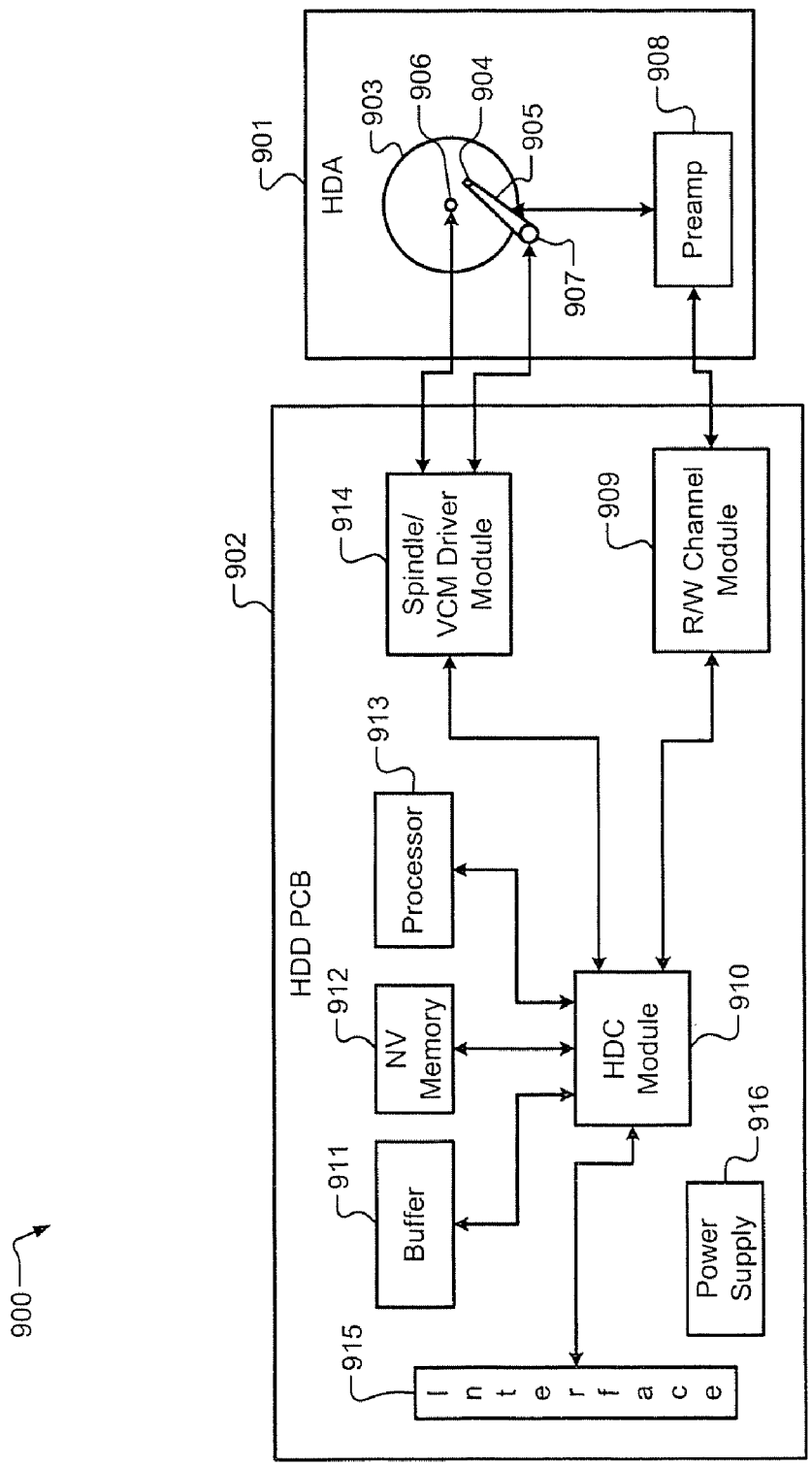
FIG. 14A is a functional block diagram of a hard disk drive.

Referring now to FIG. 14A, the teachings of the disclosure can be implemented in or in association with non-volatile memory 912 of a hard disk drive (HDD) 900. The HDD 900 includes a hard disk assembly (HDA) 901 and an HDD printed circuit board (PCB) 902. The HDA 901 may include a magnetic medium 903, such as one or more platters that store data, and a read/write device 904. The read/write device 904 may be arranged on an actuator arm 905 and may read and write data on the magnetic medium 903. Additionally, the HDA 901 includes a spindle motor 906 that rotates the magnetic medium 903 and a voice-coil motor (VCM) 907 that actuates the actuator arm 905. A preamplifier device 908 amplifies signals generated by the read/write device 904 during read operations and provides signals to the read/write device 904 during write operations.

The HDD PCB 902 includes a read/write channel module (hereinafter, "read channel") 909, a hard disk control module (HDC) module 910, a buffer 911, non-volatile memory 912, a processor 913, and a spindle/VCM driver module 914. The read channel 909 processes data received from and transmitted to the preamplifier device 908. The HDC module 910 controls components of the HDA 901 and communicates with an external device (not shown) via an I/O interface 915. The external device may include a computer, a multimedia device, a mobile computing device, etc. The I/O interface 915 may include wireline and/or wireless communication links.

The HDC module 910 may receive data from the HDA 901, the read channel 909, the buffer 911, non-volatile memory 912, the processor 913, the spindle/VCM driver module 914, and/or the I/O interface 915. The processor 913 may process the data, including encoding, decoding, filtering, and/or formatting. The processed data may be output to the HDA 901, the read channel 909, the buffer 911, non-volatile memory 912, the processor 913, the spindle/VCM driver module 914, and/or the I/O interface 915.

The HDC module 910 may use the buffer 911 and/or non-volatile memory 912 to store data related to the control and operation of the HDD 900. The buffer 911 may include DRAM, SDRAM, etc. Nonvolatile memory 912 may include any suitable type of semiconductor or solid-state memory, such as flash memory (including NAND and NOR flash memory), phase change memory, magnetic RAM, and multi-state memory, in which each memory cell has more than two states. The spindle/VCM driver module 914 controls the spindle motor 906 and the VCM 907. The HDD PCB 902 includes a power supply 916 that provides power to the components of the HDD 900.

Figure 14B:
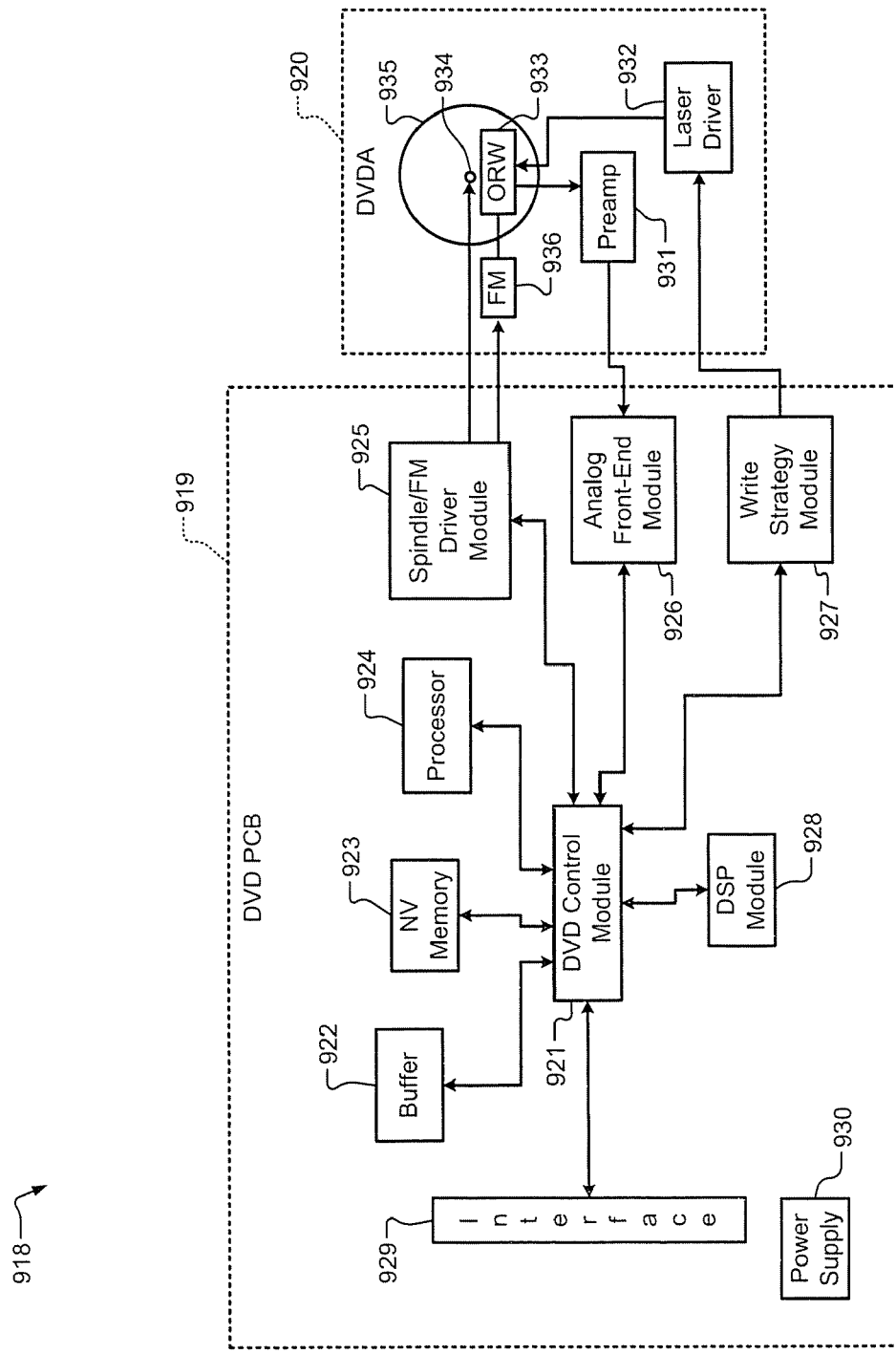
FIG. 14B is a functional block diagram of a digital versatile disc (DVD) drive.

Referring now to FIG. 14B, the teachings of the disclosure can be implemented in or in association with non-volatile memory 923 of a DVD drive 918 or of a CD drive (not shown). The DVD drive 918 includes a DVD PCB 919 and a DVD assembly (DVDA) 920. The DVD PCB 919 includes a DVD control module 921, a buffer 922, non-volatile memory 923, a processor 924, a spindle/FM (feed motor) driver module 925, an analog front-end module 926, a write strategy module 927, and a DSP module 928.

The DVD control module 921 controls components of the DVDA 920 and communicates with an external device (not shown) via an I/O interface 929. The external device may include a computer, a multimedia device, a mobile computing device, etc. The I/O interface 929 may include wireline and/or wireless communication links.

The DVD control module 921 may receive data from the buffer 922, non-volatile memory 923, the processor 924, the spindle/FM driver module 925, the analog front-end module 926, the write strategy module 927, the DSP module 928, and/or the I/O interface 929. The processor 924 may process the data, including encoding, decoding, filtering, and/or formatting. The DSP module 928 performs signal processing, such as video and/or audio coding/decoding. The processed data may be output to the buffer 922, non-volatile memory 923, the processor 924, the spindle/FM driver module 925, the analog front-end module 926, the write strategy module 927, the DSP module 928, and/or the I/O interface 929.

The DVD control module 921 may use the buffer 922 and/or non-volatile memory 923 to store data related to the control and operation of the DVD drive 918. The buffer 922 may include DRAM, SDRAM, etc. Nonvolatile memory 923 may include any suitable type of semiconductor or solid-state memory, such as flash memory (including NAND and NOR flash memory), phase change memory, magnetic RAM, and multi-state memory, in which each memory cell has more than two states. The DVD PCB 919 includes a power supply 930 that provides power to the components of the DVD drive 918.

The DVDA 920 may include a preamplifier device 931, a laser driver 932, and an optical device 933, which may be an optical read/write (ORW) device or an optical read-only (OR) device. A spindle motor 934 rotates an optical storage medium 935, and a feed motor 936 actuates the optical device 933 relative to the optical storage medium 935.

When reading data from the optical storage medium 935, the laser driver provides a read power to the optical device 933. The optical device 933 detects data from the optical storage medium 935, and transmits the data to the preamplifier device 931. The analog front-end module 926 receives data from the preamplifier device 931 and performs such functions as filtering and A/D conversion. To write to the optical storage medium 935, the write strategy module 927 transmits power level and timing data to the laser driver 932. The laser driver 932 controls the optical device 933 to write data to the optical storage medium 935.

Figure 14D:
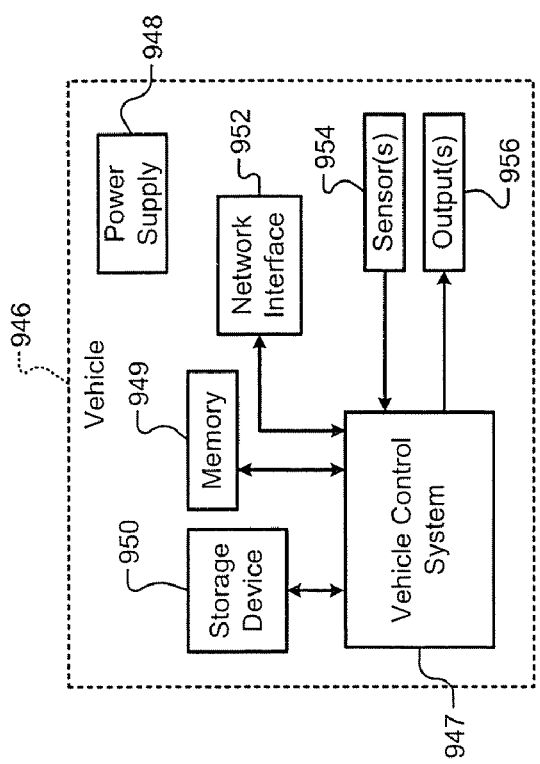
FIG. 14D is a functional block diagram of a vehicle.
Figure 14C:
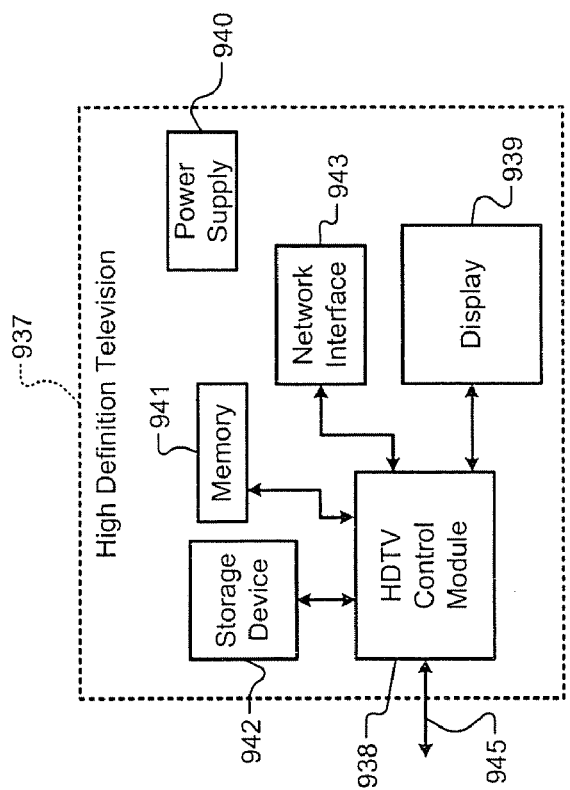
FIG. 14C is a functional block diagram of a high definition television.

Referring now to FIG. 14C, the teachings of the disclosure can be implemented in or in association with memory 941 of a high definition television (HDTV) 937. The HDTV 937 includes an HDTV control module 938, a display 939, a power supply 940, memory 941, a storage device 942, a network interface 943, and an external interface 945. If the network interface 943 includes a wireless local area network interface, an antenna (not shown) may be included.

The HDTV 937 can receive input signals from the network interface 943 and/or the external interface 945, which can send and receive data via cable, broadband Internet, and/or satellite. The HDTV control module 938 may process the input signals, including encoding, decoding, filtering, and/or formatting, and generate output signals. The output signals may be communicated to one or more of the display 939, memory 941, the storage device 942, the network interface 943, and the external interface 945.

Memory 941 may include random access memory (RAM) and/or non-volatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 942 may include an optical storage drive, such as a DVD drive, and/or a hard disk drive (HDD). The HDTV control module 938 communicates externally via the network interface 943 and/or the external interface 945. The power supply 940 provides power to the components of the HDTV 937.

Referring now to FIG. 14D, the teachings of the disclosure may be implemented in or in association with memory 949 of a vehicle 946. The vehicle 946 may include a vehicle control system 947, a power supply 948, memory 949, a storage device 950, and a network interface 952. If the network interface 952 includes a wireless local area network interface, an antenna (not shown) may be included. The vehicle control system 947 may be a powertrain control system, a body control system, an entertainment control system, an anti-lock braking system (ABS), a navigation system, a telematics system, a lane departure system, an adaptive cruise control system, etc.

The vehicle control system 947 may communicate with one or more sensors 954 and generate one or more output signals 956. The sensors 954 may include temperature sensors, acceleration sensors, pressure sensors, rotational sensors, airflow sensors, etc. The output signals 956 may control engine operating parameters, transmission operating parameters, suspension parameters, etc.

The power supply 948 provides power to the components of the vehicle 946. The vehicle control system 947 may store data in memory 949 and/or the storage device 950. Memory 949 may include random access memory (RAM) and/or non-volatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 950 may include an optical storage drive, such as a DVD drive, and/or a hard disk drive (HDD). The vehicle control system 947 may communicate externally using the network interface 952.

Figure 14F:
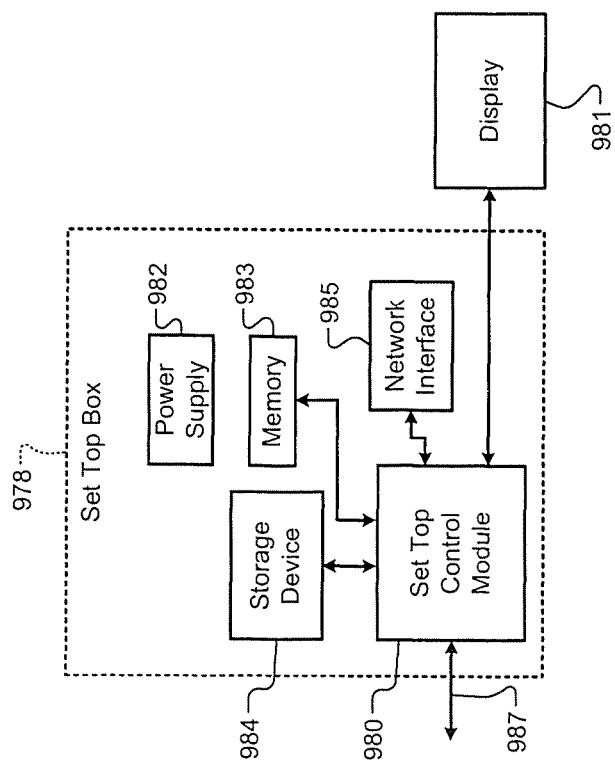
FIG. 14F is a functional block diagram of a set top box.
Figure 14E:
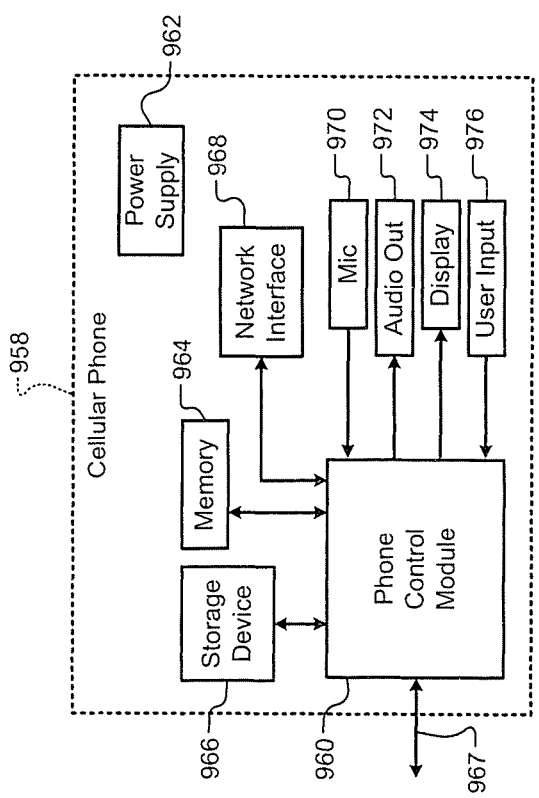
FIG. 14E is a functional block diagram of a cellular phone.

Referring now to FIG. 14E, the teachings of the disclosure can be implemented in or in association with memory 964 of a cellular phone 958. The cellular phone 958 includes a phone control module 960, a power supply 962, memory 964, a storage device 966, and a cellular network interface 967. The cellular phone 958 may include a network interface 968, a microphone 970, an audio output 972 such as a speaker and/or output jack, a display 974, and a user input device 976 such as a keypad and/or pointing device. If the network interface 968 includes a wireless local area network interface, an antenna (not shown) may be included.

The phone control module 960 may receive input signals from the cellular network interface 967, the network interface 968, the microphone 970, and/or the user input device 976. The phone control module 960 may process signals, including encoding, decoding, filtering, and/or formatting, and generate output signals. The output signals may be communicated to one or more of memory 964, the storage device 966, the cellular network interface 967, the network interface 968, and the audio output 972.

Memory 964 may include random access memory (RAM) and/or non-volatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 966 may include an optical storage drive, such as a DVD drive, and/or a hard disk drive (HDD). The power supply 962 provides power to the components of the cellular phone 958.

Referring now to FIG. 14F, the teachings of the disclosure can be implemented in or in association with memory 983 of a set top box 978. The set top box 978 includes a set top control module 980, a display 981, a power supply 982, memory 983, a storage device 984, and a network interface 985. If the network interface 985 includes a wireless local area network interface, an antenna (not shown) may be included.

The set top control module 980 may receive input signals from the network interface 985 and an external interface 987, which can send and receive data via cable, broadband Internet, and/or satellite. The set top control module 980 may process signals, including encoding, decoding, filtering, and/or formatting, and generate output signals. The output signals may include audio and/or video signals in standard and/or high definition formats. The output signals may be communicated to the network interface 985 and/or to the display 981. The display 981 may include a television, a projector, and/or a monitor.

The power supply 982 provides power to the components of the set top box 978. Memory 983 may include random access memory (RAM) and/or non-volatile memory. Non-volatile memory may include any suitable type of semiconductor or solid-state memory, such as flash memory (including NAND and NOR flash memory), phase change memory, magnetic RAM, and multi-state memory, in which each memory cell has more than two states. The storage device 984 may include an optical storage drive, such as a DVD drive, and/or a hard disk drive (HDD).

Figure 14G:
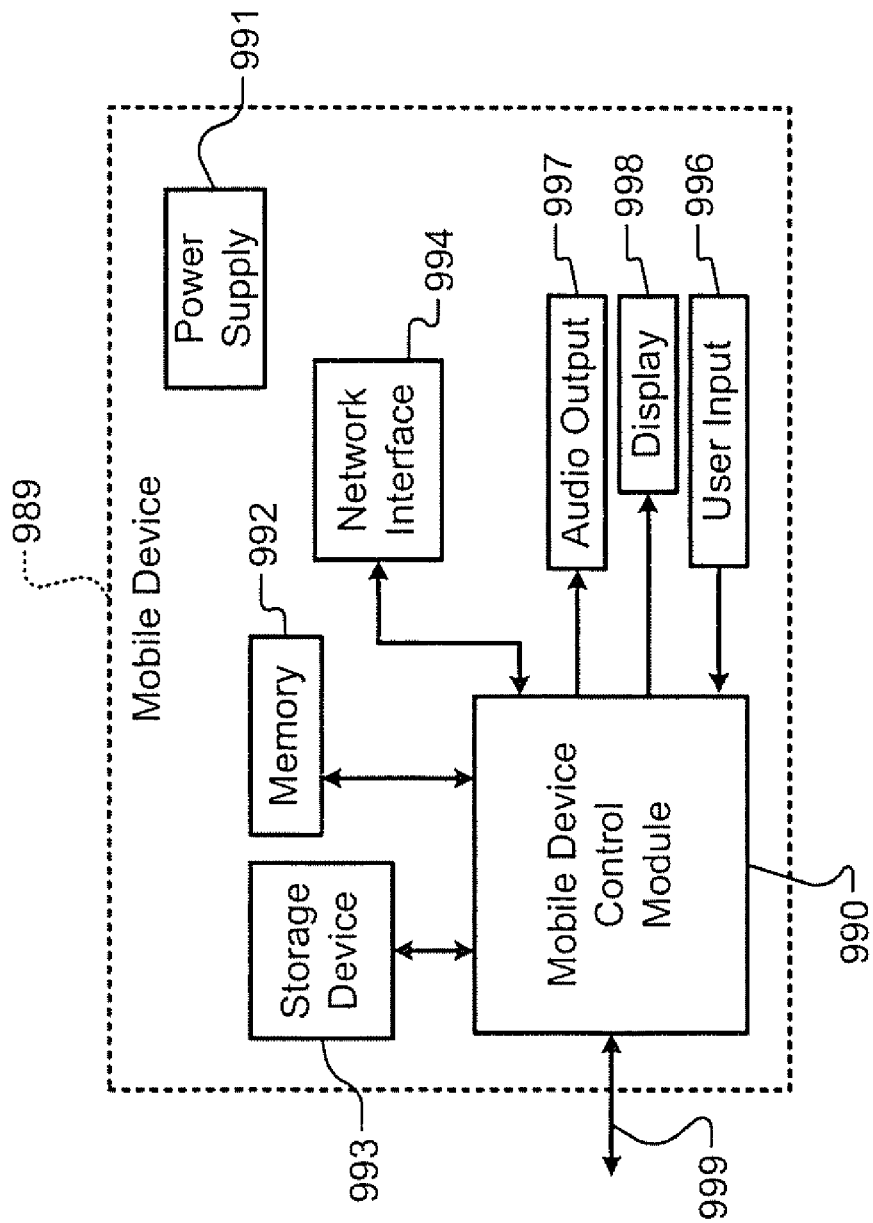
FIG. 14G is a functional block diagram of a mobile device.

Referring now to FIG. 14G, the teachings of the disclosure can be implemented in or in association with memory 992 of a mobile device 989. The mobile device 989 may include a mobile device control module 990, a power supply 991, memory 992, a storage device 993, a network interface 994, and an external interface 999. If the network interface 994 includes a wireless local area network interface, an antenna (not shown) may be included.

The mobile device control module 990 may receive input signals from the network interface 994 and/or the external interface 999. The external interface 999 may include USB, infrared, and/or Ethernet. The input signals may include compressed audio and/or video, and may be compliant with the MP3 format. Additionally, the mobile device control module 990 may receive input from a user input 996 such as a keypad, touchpad, or individual buttons. The mobile device control module 990 may process input signals, including encoding, decoding, filtering, and/or formatting, and generate output signals.

The mobile device control module 990 may output audio signals to an audio output 997 and video signals to a display 998. The audio output 997 may include a speaker and/or an output jack. The display 998 may present a graphical user interface, which may include menus, icons, etc. The power supply 991 provides power to the components of the mobile device 989. Memory 992 may include random access memory (RAM) and/or non-volatile memory.

Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 993 may include an optical storage drive, such as a DVD drive, and/or a hard disk drive (HDD). The mobile device may include a personal digital assistant, a media player, a laptop computer, a gaming console, or other mobile computing device.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A memory system comprising:
   a first parameter estimation module that receives pilot signals that are generated based on pilot data stored in a memory,
   wherein said first parameter estimate module generates a first estimate of a signal quality value associated with a block of said memory based on reference pilot information;
   a second parameter estimation module that generates a second estimate of said signal quality value based on said first estimate and user data signals that are generated based on user data stored in said memory; and
   a processing module that generates recovered user data based on said second estimate.

2. The memory system of claim 1 further comprising:
   a first storage device that stores said pilot signals based on a read signal from said memory; and
   a second storage device that stores said user data signals based on a read signal from said memory.

3. The memory system of claim 1 wherein said first parameter estimation module provides a coarse estimate of said signal quality value and said second parameter estimation module provides a fine estimate of said signal quality value.

4. The memory system of claim 1 wherein said pilot data and said user data are stored in said block.

5. The memory system of claim 1 further comprising a demultiplexer that generates said pilot signals and user data signals based on a read signal from said memory.

6. The memory system of claim 1 further comprising said memory.

7. The memory system of claim 6 wherein said memory includes non-volatile memory.

8. The memory system of claim 1 wherein said processing module stores said pilot data in said memory when said user data is stored in said memory.

9. The memory system of claim 1 wherein said processing module reads said pilot data from said memory when said user data is read from said memory.

10. The memory system of claim 1 wherein said processing module removes said pilot data from said memory when said user data is removed from said memory.

11. The memory system of claim 1 wherein said processing module alters said pilot data between access events to pilot cells of said memory.

12. The memory system of claim 1 wherein said reference pilot information is hard-coded into firmware of the memory system.

13. The memory system of claim 1 wherein said reference pilot information is generated based on an algorithm run by the memory system.

14. The memory system of claim 1 wherein said reference pilot information is stored in said memory as said pilot data during an initial access to said memory.

15. The memory system of claim 1 further comprising another memory that stores said reference pilot information.

16. The memory system of claim 1 further comprising:
a defect detection module that detects a defect of said memory based on at least one of said first estimate and said second estimate; and
a control module that adjusts access to said memory based on said defect.

17. The memory system of claim 16 wherein said control module adjusts access to said memory when at least one of said first estimate and said second estimate exceeds a threshold.

18. The memory system of claim 17 wherein said at least one threshold comprises at least one of a mean threshold, a variance threshold, a distance between mean values threshold, a signal-to-noise ratio threshold, and an error count threshold.

19. The memory system of claim 17 wherein said control module sets said at least one threshold based on at least one of an ambient temperature, a number of access cycles, and a signal-to-noise ratio.

20. The memory system of claim 1 further comprising a defect detection module that detects a defect of said memory based on said first estimate and not said second estimate.

21. The memory system of claim 1 wherein said first estimate includes at least one of a signal-to-noise ratio and an estimated count of pilot signal errors.

22. The memory system of claim 1 wherein each of said first estimate and said second estimate comprises at least one of a mean value, a variance value, and a distance between mean values.

23. The memory system of claim 1 further comprising a slicer that detects when at least one of said first estimate and said second estimate exceeds a threshold.

24. The memory system of claim 1 wherein said first parameter estimation module generates said first estimate based on a first least means squared (LMS) process, and
wherein said second parameter estimation module generates said second estimate based on a second LMS process.

25. The memory system of claim 1 wherein said second parameter estimation module generates said second estimate based on an iterative process that is initialized with said first estimate.

26. A memory system comprising:
a first parameter estimation module that receives pilot signals based on a read signal from a memory and that generates a first estimate of a signal quality value associated with a block of said memory based on reference pilot information;
a detection module that detects a defect in said block based on said first estimate; and
a control module that alters access to said block based on said defect.

27. The memory system of claim 26 further comprising a storage device that stores said pilot signals based on said read signal,
wherein said first parameter estimation module receives said pilot signals from said storage device.

28. The memory system of claim 26 wherein said control module selectively prevents writing to, reading from, and erasing from said block based on said defect.

29. The memory system of claim 26 wherein said control module selectively prevents writing to said block when said first estimate exceeds a first threshold and selectively prevents access to said block when said first estimate exceeds a second threshold.

30. The memory system of claim 26 wherein said control module selectively adjusts access to said memory when at least one of said first estimate and a second estimate of said signal quality value exceeds a threshold.

31. The memory system of claim 30 wherein said at least one threshold comprises at least one of a mean threshold, a variance threshold, a distance between mean values threshold, a signal-to-noise ratio threshold, and an error count threshold.

32. The memory system of claim 30 wherein said control module sets said at least one threshold based on at least one of an ambient temperature, a number of access cycles, and a signal-to-noise ratio.

33. The memory system of claim 26 wherein said first parameter estimation module generates said first estimate based on a first least means squared (LMS) process.

34. The memory system of claim 33 wherein said control module alters access to said block based on said first estimate and a second estimate that is generated via a second LMS process that is based on said first estimate.

35. The memory system of claim 34 wherein said second LMS process is an iterative process that is initialized with said first estimate.

36. The memory system of claim 26 further comprising a second parameter estimation module that generates a second estimate of said signal quality value based on at least one of said first estimate and user data signals,
wherein said user data signals are generated based on user data stored in said block, and
wherein said detection module detects said defect based on said second estimate.

37. The memory system of claim 26 further comprising a defect memory that stores a defect map of defects of said block.

38. The memory system of claim 37 wherein said defect map maps signal quality values to locations of said memory.

39. The memory system of claim 26 further comprising an error counter that has an error value that is incremented when an error in one of said pilot signals is detected.

40. The memory system of claim 39 wherein said detection module stores said error value in a defect memory in reference to said block.

41. The memory system of claim 26 further comprising a signal processing module that generates recovered user data that is based on user data that is stored in said memory and said first estimate.

42. The memory system of claim 26 further comprising a second parameter estimation module that generates a second estimate of said signal quality value based on at least one of said first estimate and user data signals stored in said memory.

43. The memory system of claim 42 wherein said detection module detects said defect based on said first estimate and said second estimate.

44. The memory system of claim 42 wherein said detection module detects said defect based on said first estimate and not said second estimate.

45. The memory system of claim 26 wherein said first estimate includes a signal-to-noise ratio value.

46. The memory system of claim 26 wherein said first estimate includes at least one of a mean value, a variance value, a standard deviation value, and a distance between mean values.

47. A memory system comprising:
a first parameter estimation module that generates a first estimate of a signal quality value based on user data signals that are generated based on a read signal from a memory;

a detection module that detects a defect in a block of said memory based on said first estimate; and a control module that alters access to said block based on said defect.

48. The memory system of claim 47 further comprising a storage device that stores said user data signals based on said read signal, wherein said first parameter estimation module receives said user data signals from said storage device.

49. The memory system of claim 47 wherein said control module prevents writing to, reading from, and erasing from said block based on said defect.

50. The memory system of claim 47 wherein said control module prevents writing to said block when said first estimate exceeds a first threshold and prevents access to said block when said first estimate exceeds a second threshold.

51. The memory system of claim 47 wherein said control module adjusts access to said memory when said first estimate exceeds a threshold.

52. The memory system of claim 51 wherein said at least one threshold comprises at least one of a mean threshold, a variance threshold, a distance between mean values threshold, a signal-to-noise ratio threshold, and an error threshold.

53. The memory system of claim 51 wherein said control module sets said at least one threshold based on at least one of an ambient temperature, a number of access cycles, and a signal-to-noise ratio.

54. The memory system of claim 47 wherein said first parameter estimation module generates said first estimate based on a first least means squared (LMS) process.

55. The memory system of claim 54 wherein said control module alters access to said block based on said first estimate and a second estimate that is generated via a second LMS process that is based on said first estimate.

56. The memory system of claim 55 wherein said second LMS process is an iterative process that is initialized with said first estimate.

57. The memory system of claim 47 further comprising a second parameter estimation module that generates a second estimate of said signal quality value based on said first estimate and pilot signals that are generated based on pilot data stored in said memory, wherein said detection module detects said defect based on said second estimate.

58. The memory system of claim 47 further comprising a defect memory that stores a defect map that stores a defect map of defects of said block.

59. The memory system of claim 58 wherein said defect map maps signal quality values to locations of said memory.

60. The memory system of claim 59 further comprising an error counter that has an error value that is incremented when an error in one of said user data signals is detected.

61. The memory system of claim 60 wherein said detection module stores said error value in a defect memory in reference to said block.

62. The memory system of claim 47 wherein said first parameter estimation module generates said first estimate based on a decision feedback signal generated based on a decoded user data signal.

63. The memory system of claim 47 further comprising a signal processing module that generates recovered user data based on said user data signals and said first estimate.

64. The memory system of claim 47 further comprising a second parameter estimation module that generates a second estimate of said signal quality value based on pilot signals that are generated based on pilot data stored in said block.

65. The memory system of claim 64 wherein said detection module detects said defect based on said first estimate and said second estimate.

66. The memory system of claim 64 wherein said detection module detects said defect based on said first estimate and not said second estimate.

67. The memory system of claim 47 wherein said first estimate includes a signal-to-noise ratio value.

68. The memory of claim 47 wherein said first estimate includes at least one of a mean value, a variance value, a standard deviation value, and a distance between mean values.

\* \* \* \* \*